(12) United States Patent
Mahendra

(10) Patent No.: US 12,292,458 B2
(45) Date of Patent: May 6, 2025

(54) SYSTEMS AND METHODS FOR GENERATING AND MEASURING ELECTRICAL SIGNALS

(71) Applicant: Nicslab, Inc., Middletown, DE (US)

(72) Inventor: Andri Mahendra, Middletown, DE (US)

(73) Assignee: Nicslab, Inc., Middletown, DE (US)

( * ) Notice: Subject to any disclaimer, the term of this patent is extended or adjusted under 35 U.S.C. 154(b) by 6 days.

(21) Appl. No.: 18/007,034

(22) PCT Filed: Jul. 26, 2021

(86) PCT No.: PCT/IB2021/056696
§ 371 (c)(1),
(2) Date: Jan. 26, 2023

(87) PCT Pub. No.: WO2022/023915
PCT Pub. Date: Feb. 3, 2022

(65) Prior Publication Data
US 2023/0288452 A1    Sep. 14, 2023

(30) Foreign Application Priority Data
Jul. 27, 2020    (AU) .................... 2020902625

(51) Int. Cl.
*G01R 15/04*    (2006.01)
*G01R 19/25*    (2006.01)

(52) U.S. Cl.
CPC ............ *G01R 15/04* (2013.01); *G01R 19/25* (2013.01)

(58) Field of Classification Search
CPC .... G01R 15/04; G01R 19/25; G01R 31/3004; G01R 31/316; G01R 31/31712;
(Continued)

(56) References Cited

U.S. PATENT DOCUMENTS

2003/0174137 A1* 9/2003 Leung ..................... G09G 5/39
345/531
2006/0132165 A1   6/2006 Walker et al.
(Continued)

FOREIGN PATENT DOCUMENTS

KR        101918167 B1    11/2018

OTHER PUBLICATIONS

International Search Report and Written Opinion mailed on Sep. 28, 2021 in PCT/IB2021/0546696.
(Continued)

*Primary Examiner* — Jermele M Hollington
*Assistant Examiner* — Zannatul Ferdous
(74) *Attorney, Agent, or Firm* — Knobbe, Martens, Olson & Bear, LLP

(57) ABSTRACT

Disclosed is a system for generating and measuring electrical signals. The system comprises a digital-to-analog converter module configured to generate one or more analog signals based on a control signal, and one or more channels. Each channel comprises an output terminal configured to be electrically connected to an electrical device, and a buffer circuit. The buffer circuit is configured to receive an analog signal of the one or more analog signals and to provide to the output terminal a voltage based on the voltage of the received analog signal. The buffer circuit is further configured to be electrically connected to a current source and to allow current to flow between the current source and the output terminal. The system further comprises a voltage measurement system and a current measurement system. The voltage measurement system is configured to measure, for each channel, a voltage indicative of the voltage at the output terminal of the channel. The current measurement system is configured to measure, for each channel, the current flowing through the output terminal of the channel.

(Continued)

Also disclosed is method for generating and measuring electrical signals.

20 Claims, 10 Drawing Sheets

(58) Field of Classification Search
CPC ........ G01R 31/31917; G01R 31/31924; G01R 31/2601; G01R 1/28; G01R 17/02
See application file for complete search history.

(56) References Cited

U.S. PATENT DOCUMENTS

| | | |
|---|---|---|
| 2006/0267922 A1* | 11/2006 | Kim .................. H05B 45/50 345/102 |
| 2009/0121908 A1* | 5/2009 | Regier ............... G01R 31/3163 341/142 |
| 2013/0156084 A1* | 6/2013 | Kang ................. H03F 3/45183 375/228 |
| 2014/0266412 A1 | 9/2014 | Alley |
| 2016/0107440 A1* | 4/2016 | Kanzawa ............ B41J 2/14274 347/10 |
| 2017/0264295 A1 | 9/2017 | Slattery et al. |
| 2020/0412348 A1* | 12/2020 | Pons .................. H03K 5/01 |
| 2021/0028792 A1* | 1/2021 | Hwang ............... A61B 8/4494 |
| 2021/0384193 A1* | 12/2021 | Kimura ............... H10B 12/00 |

OTHER PUBLICATIONS

International Preliminary Report on Patentability mailed on Jun. 20, 2022 in PCT/IB2021/0546696.

\* cited by examiner

SYSTEMS AND METHODS FOR GENERATING AND MEASURING ELECTRICAL SIGNALS

TECHNICAL FIELD

The present invention relates to methods and systems for generating and measuring electrical signals.

BACKGROUND

A source measure unit (SMU), also known as a source-measurement unit, is an electronic device configured to simultaneously supply and measure an electrical signal whose characteristics may be set or changed using the SMU's controls. SMUs are commonly used in industry and laboratory settings to test electronic components and to accurately monitor currents and voltages supplied to electrical circuits.

A typical SMU is a standalone, benchtop device powered either by mains electricity or battery and having between one and four output ports. However, the number of signals required by certain applications to be supplied and measured exceeds the capacity of typical SMUs. For example, photonic integrated circuits may contain tens or hundreds of active electronic elements having different power and sensing requirements.

Such applications require multiple SMUs, or, if these are not available, a combination of multiple sensors and signal generators or power sources to separately supply and measure the required number of electrical signals. These solutions however usually entail higher cost and space requirements, which are limited resources. Furthermore, the complexity of controlling multiple SMUs or multiple sensors, signal generators, and power sources increases rapidly with the number of these devices.

It is desired to address or ameliorate one or more disadvantages or limitations associated with the prior art, or to at least provide a useful alternative.

The reference in this specification to any prior publication (or information derived from it), or to any matter which is known, is not, and should not be taken as, an acknowledgement or admission or any form of suggestion that that prior publication (or information derived from it) or known matter forms part of the common general knowledge in the field of endeavour to which this specification relates.

SUMMARY

According to an example aspect, there is provided a system for generating and measuring electrical signals. The system comprises a digital-to-analog converter module configured to generate one or more analog signals based on a control signal, and one or more channels. Each channel comprises: an output terminal configured to be electrically connected to an electrical device; and a buffer circuit configured to receive an analog signal of the one or more analog signals and to provide to the output terminal a voltage based on the voltage of the received analog signal, and further configured to be electrically connected to a current source and to allow current to flow between the current source and the output terminal. The system further comprises a voltage measurement system configured to measure, for each channel, a voltage indicative of the voltage at the output terminal of the channel; and a current measurement system configured to measure, for each channel, the current flowing through the output terminal of the channel.

In certain embodiments, the digital-to-analog converter module is a voltage source digital-to-analog converter module configured to control the voltage of the one or more analog signals based on the digital control signal and on a voltage or electrical power signal received from a power supply. In certain embodiments, the one or more analog signals are one or more voltage signals, wherein the control signal is a first control signal, wherein the current source is a current source digital-to-analog converter module configured to generate one or more current signals based on a second control signal, and, for each channel of one or more of the channels, the buffer circuit is configured to receive a current signal of the one or more current signals, and to provide the current signal to the output terminal of the channel.

In certain embodiments, the digital-to-analog converter module is configured to control the polarity of the one or more analog signals. In certain embodiments, the digital-to-analog converter module comprises: a first terminal configured to receive a first voltage, wherein the first voltage is a reference voltage; a second terminal configured to receive a second voltage, wherein the second voltage is different from the reference voltage; and a third terminal. In certain embodiments, the system further comprises a switch module operatively connected to the digital-to-analog converter module, the switch module being switchable between: a first state in which the third terminal is electrically connected to the first terminal for receiving the reference voltage; and a second state in which the third terminal is electrically disconnected from the first terminal and is configured to receive a third voltage, wherein the third voltage and the second voltage have opposite polarities.

In certain embodiments, for each channel of one or more of the channels, the buffer circuit is configured to: allow the current source to supply a current to the output terminal when the electrical device draws the current from the output terminal; and allow the current source to receive a current from the output terminal when the electrical device supplies the current to the output terminal.

In certain embodiments, for each channel of one or more of the channels, the channel further comprises a current limiter configured to limit a flow of current between the current source and the output terminal. In certain embodiments, the current limiter is further configured to: determine the current supplied by the current source to the output terminal; compare the determined current to a reference value; and limit the current supplied by the current source to the output terminal if the determined current is greater than the reference value. In certain embodiments, the current limiter is configured to determine the current supplied by the current source to the output terminal by measuring a voltage across a resistor electrically connected between the buffer circuit and the output terminal.

In certain embodiments, for each channel of one or more of the channels, the buffer circuit is configured to block or obstruct a flow of current between the digital-to-analog converter module and the output terminal. In certain embodiments, for each channel of one or more of the channels, the buffer circuit provides a higher impedance to the digital-to-analog converter module than to the output terminal. In certain embodiments, for each channel of one or more of the channels, the buffer circuit provides a higher impedance to the digital-to-analog converter module than to the current source.

In certain embodiments, for each channel of one or more of the channels, the buffer circuit comprises a current source digital-to-analog converter configured to generate a current signal based on a further control signal.

In certain embodiments, for each channel of one or more of the channels, the buffer circuit comprises a buffer amplifier. In certain embodiments, the buffer amplifier is a voltage buffer. In certain embodiments, the buffer amplifier comprises an operational amplifier. In certain embodiments, the buffer amplifier comprises a voltage follower.

In certain embodiments, for each channel of one or more of the channels, the output terminal is a first output terminal, the channel further comprising a second output terminal configured to be electrically connected to the same electrical device as the first output terminal, wherein the buffer circuit is configured to provide a differential voltage corresponding to the voltage of the received analog signal to the first output terminal and the second output terminal, and further configured to allow current to flow between the current source and the second output terminal. In certain embodiments, the buffer circuit comprises a single-ended to differential converter configured to provide a first voltage to the first output terminal and a second voltage to the second output terminal, wherein the difference between the first voltage and the second voltage corresponds to the voltage of the received analog signal.

In certain embodiments, the voltage measurement system is configured to measure, for each channel of one or more of the channels, a reduced voltage that is a fraction of the voltage at the output terminal of the channel, wherein the reduced voltage is produced by a voltage divider.

In certain embodiments, the system further comprises a measurement-reading processing system configured to: receive, from the voltage measurement system, voltage data indicative of the voltage measured for each channel; receive, from the current measurement system, current data indicative of the current measured for each channel; determine, for each channel, the voltage at the output terminal based on the received voltage data; and determine, for each channel, the current flowing through the output terminal based on the received current data.

In certain embodiments, the voltage measurement system comprises a voltage-measurement analog-to-digital converter module configured to: receive, from each channel, an analog voltage indicative of the voltage at the output terminal of the channel; and generate, for each channel, a voltage measurement signal representing the analog voltage received from the channel, wherein the voltage measurement signal is a digital signal. In certain embodiments, the voltage-measurement analog-to-digital converter module is electrically connected to each channel through a voltage divider.

In certain embodiments, the current measurement system comprises: one or more current sensors, each current sensor being configured to sense the current flowing through the output terminal of a channel of the one or more channels; and a current-measurement analog-to-digital converter module configured to: receive, from each current sensor, an analog signal indicative of the current sensed by the current sensor; and generate, for each channel, a current measurement signal representing the analog signal received from the current sensor associated with the channel, wherein the current measurement signal is a digital signal.

In certain embodiments, the system further comprises a measurement-reading processing system configured to: receive the voltage measurement signal and the current measurement signal for each channel; determine, for each channel, the voltage at the output terminal of the channel based on the received voltage measurement signal; and determine, for each channel, the current flowing through the output terminal of the channel based on the received current measurement signal. In certain embodiments, the measurement-reading processing system is configured to communicate with the voltage-measurement analog-to-digital converter module and with the current-measurement analog-to-digital converter module through a serial peripheral interface (SPI) or I$^2$C.

In certain embodiments, the system further comprises a communication module configured to: receive, from the measurement-reading processing system, the determined voltage and the determined current values for each channel of one or more of the channels; and transmit the received voltage and current values to a remote receiver.

In certain embodiments, the system further comprises a setting-control processing system configured to: generate one or more control signals; wherein the digital-to-analog converter module is configured to receive the control signal from the setting-control processing system. In certain embodiments, the setting-control processing system is configured to communicate with the digital-to-analog converter module through a serial peripheral interface (SPI) or I$^2$C. In certain embodiments, the setting-control processing system and the measurement-reading processing system are the same processing system.

According to another example aspect, there is provided a system for generating and measuring electrical signals. The system comprises: a voltage source digital-to-analog converter module configured to generate one or more voltage signals based on a first control signal; a current source digital-to-analog converter module configured to generate one or more current signals based on a second control signal; and one or more channels. Each channel comprises: an output terminal configured to be electrically connected to an electrical device; and a buffer circuit configured to receive a voltage signal of the one or more voltage signals and a current signal of the one or more current signals, and to provide to the output terminal the received voltage signal and the received current signal. The system further comprises: a voltage measurement system configured to measure, for each channel, a voltage indicative of the voltage at the output terminal of the channel; and a current measurement system configured to measure, for each channel, the current flowing through the output terminal of the channel.

In certain embodiments, for at least one channel of one or more of the channels, the buffer circuit is configured to amplify the received current signal.

According to another example aspect, there is provided a system for generating and measuring electrical signals. The system comprises: one or more current sources configured to generate one or more current signals based on a control signal; one or more channels, each channel comprising an output terminal configured to be electrically connected to an electrical device, wherein each channel is configured to receive a current signal of the one or more current signals and to provide the current signal to the output terminal of the channel; a voltage measurement system configured to measure, for each channel, a voltage indicative of the voltage at the output terminal of the channel; and a current measurement system configured to measure, for each channel, the current flowing through the output terminal of the channel.

In certain embodiments, the one or more current sources form part of a current source digital-to-analog converter module. In certain embodiments, each current source is configured to control the current of the one or more current signals based on the control signal and/or on an electric power received from a power supply.

In certain embodiments, any of the forementioned systems is a source measure unit.

According to another example aspect, there is provided a system for monitoring electricity consumption. The system comprises one or more systems for generating and measuring electrical signals as described above; and a data centre configured to receive data representing voltages and currents determined by the voltage measurement system and the current measurement system of each system of the one or more systems for generating and measuring electrical signals.

According to another example aspect, there is provided an electricity meter comprising: a system for generating and measuring electrical signals as described above; a switch module configured to electrically connect the system for generating and measuring electrical signals to an electrical source for supplying electrical power to active components of the system for generating and measuring electrical signals; and a processing system. The processing system is configured to: receive data representing voltages and currents determined by the voltage measurement system and the current measurement system of the system for generating and measuring electrical signals; and operate a display device to display the received data.

According to another example aspect, there is provided a system for monitoring a plurality of independent signal generators. The system comprises: a plurality of systems for generating and measuring electrical signals as described above; a power distribution unit configured to receive electrical power from a power source and to distribute the received electrical power to each system of the plurality of systems for generating and measuring electrical signals; and a processing system. The processing system is configured to: receive data representing voltages and currents determined by the voltage measurement system and the current measurement system of each system of the plurality of systems for generating and measuring electrical signals; and control operational parameter of each system of the plurality of systems for generating and measuring electrical signals.

According to another example aspect, there is provided a method for generating and measuring electrical signals. The method comprises: generating one or more voltage signals based on a first control signal; generating one or more current signals based on a second control signal; providing, for each voltage signal and each current signal, the voltage signal and the current signal to an output terminal of one or more output terminals through a buffer circuit of one or more buffer circuits; measuring, for each output terminal, a voltage indicative of the voltage at the output terminal; and measuring, for each output terminal, a current indicative of the flowing through the output terminal.

In certain embodiments, each buffer circuit provides a higher impedance to the voltage signal than to the current signal. In certain embodiments, the method further comprises amplifying one or more of the current signals.

According to another example aspect, there is provided a source measurement system comprising: one or more processing systems configured to generate one or more control signals; and one or more digital-to-analog converters and analog-to-digital converters operatively coupled to the one or more processing systems. The source measurement unit is configured to: receive a control signal of the one or more control signals; measure an electrical signal input and output; and generate a plurality of output electrical signals using the received control signal.

In certain embodiments, the source measurement unit comprises a central data processing unit, digital-to-analog and analog-to-digital converters and sensors configured to convert the accumulated electrical signal. In certain embodiments, the control signal is an analog or a digital signal. In certain embodiments, the digital-to-analog converter has a multi-range output, and the plurality of output signals are analog signals with bipolar, unipolar, or differential mode configuration.

According to another example aspect, there is provided a source measurement system. The source measurement system comprises one or more processing systems configured to measure, analyse, and generate electrical signal. The one or more processing systems are configured to communicate and accumulate reading data and also set the output signal generation. The source measurement unit is configured to enable sourcing and reading multiple outputs including bipolar, unipolar, and differential electrical signals.

BRIEF DESCRIPTION OF THE DRAWINGS

Some embodiments of the present invention are described below, by way of example only, with reference to the accompanying drawings, in which.

DETAILED DESCRIPTION

Figure 1:
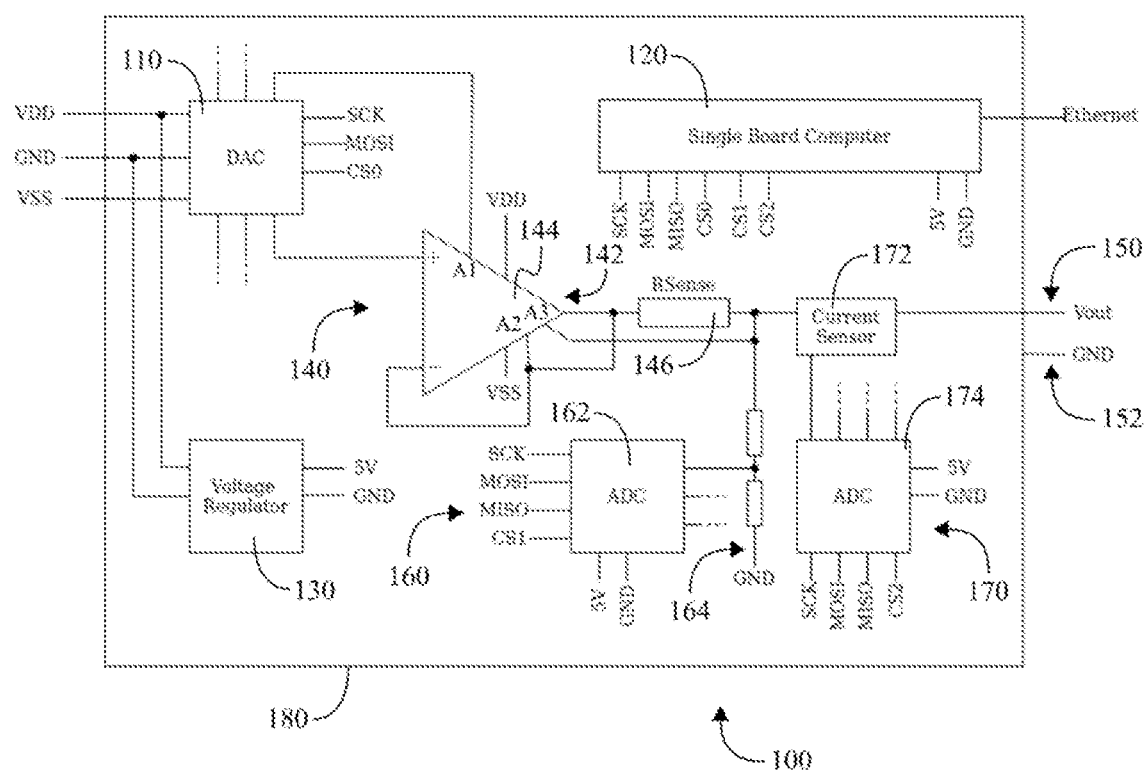
FIG. 1 is an example system for generating and measuring electrical signals with single-ended outputs.

Described herein are systems and methods for sourcing, measuring, and/or controlling one or more electrical signals.

Embodiments of the invention provide a system, such as a source measure unit or a source-measurement unit (SMU), for generating and measuring electrical signals. The system comprises a digital-to-analog converter (DAC) module configured to generate one or more analog or electrical signals based on a control signal, such as a digital control signal. The system further one or more channels, which may be known as power conditioning channels or power channels. Each channel comprises an output or load terminal configured to be electrically connected to an electrical device, and a buffer circuit. The buffer circuit of a channel is configured to receive an analog signal of the one or more analog signals and to provide to the output terminal a voltage and/or a current, which may be based on the voltage and/or current of the received analog signal. The buffer circuit of a channel may further be configured to be electrically connected to an electrical power supply, such as a current source, to amplify, boost, supplement, or otherwise control the voltage and/or current provided by the buffer circuit to the output terminal of the channel. The system further comprises a voltage measurement system or apparatus and a current measurement system or apparatus. The voltage measurement system is configured to measure, for each channel, a voltage indicative of a voltage at the output terminal of the channel. The current measurement system is configured to measure, for each channel, a current flowing through the output terminal of the channel.

A channel may be an electrical circuit in which electrical characteristics (e.g. voltage and/or current) of an analog signal are conditioned, controlled, or adjusted. Each channel (including its respective components) may operate independently of the other channels. Therefore, a voltage and/or a current provided to the output terminal of a channel may be controlled independently of voltages and/or currents provided to the output terminals of other channels of the system.

Each channel may comprise one or more output terminals configured to be electrically connected to an electrical device, such as an electrical load or a device under test. Each output terminal may therefore comprise one or more electrical connectors, ports, or pins. The electrical device may be an active or passive device. Each output terminal is configured to convey voltages and/or currents between the channel and the electrical device connected thereto.

Each buffer circuit may provide electrical impedance transformation to allow voltages and currents generated by the system to drive or power an electrical device connected to an output terminal. Each buffer circuit may present a high impedance to input voltage signals and a low output impedance. Each buffer circuit may further present a low impedance to input current signals. In some examples, the impedance of a buffer circuit isolates or separates an input stage of the system from an output stage. Example buffer circuits include, but are not limited to, buffer amplifiers, voltage buffers, current buffers, and current source DACs (e.g. LTC2662).

Each control signal may be a digital signal. Each analog signal may be an electrical signal comprising a voltage and/or a current. A voltage signal may be an analog signal whose voltage value may be set, predetermined, or controlled. A current signal may be an analog signal whose current value may be set, predetermined, or controlled. The voltage and/or the current of each analog signal may vary in time or may be constant.

The voltage and current measured by the voltage and current measurement systems, respectively, may be indicative of or represent the voltage or current at the output terminal of a channel (i.e. an indirect measurement by measuring a voltage or current whose relation to the voltage or current at the output terminal is known) or, in other examples, may be the voltage or current at the output terminal (i.e. a direct measurement). The voltage measurement system and the current measurement system may allow for real-time determination of the voltage and current provided by each output terminal or channel to an electrical device connected thereto.

The system for generating and measuring electrical signals may be compact and may provide a wide signal output range. In some examples, the system is an integrated system configured to output a unipolar, bipolar, and/or differential mode power range in the same platform using digital control or with software programming. In some examples, the system provides integrated individual digital and analog current reading output and can be configured with any types of sensor.

Therefore, the system for generating and measuring electrical signals may function as a power source (providing voltage and current) and/or as a signal generator (providing a time-varying voltage and/or current) with multi-range capability including unipolar, bipolar, single-ended, and differential outputs, controllable through software. The type of signal (e.g. sawtooth, pulse, sinusoidal) and the output range provided to each output terminal of the system may be controlled through software, such as through a processing system. Examples of bipolar and unipolar ranges for each output terminal of the system include, but are not limited to, ±2.5 V, ±5 V, ±10 V, ±20 V, 0 V to 5 V, 0 V to 10 V, 0 V to 20 V, or 0 V to 40 V, and differential output modes.

Embodiments of the invention further provide an SMU comprising one or more DAC circuits, a first electrical power source configured to generate a first electrical power level for a processing system, and a second electrical power source configured to generate a second electrical power level for one or more buffer circuits. The SMU further comprises one or more sensors operatively coupled to one or more analog-to-digital converter (ADC) circuits. Each DAC circuit and each ADC circuit is configured to receive a control signal of one or more control signals, and to receive a portion of the buffer power input and processing power input.

Each DAC circuit and each ADC circuit may comprise a module configured to convert the control signal into a plurality of intermediate signals. The control signals may be digital or analog signals. In some examples, the plurality of intermediate signals are analog signals. In some examples, the SMU further comprises a switching module configured to route each intermediate signal of the plurality of intermediate signals to a signal conditioner of a plurality of signal conditioners. In some examples, the processing system is further configured to: monitor the plurality of output electrical signals of the one or more digital-to-analog converter and voltage divider outputs, and to adjust operational parameters of the one or more digital-to-analog converter to modify a value of the respective plurality of output electrical signals. In some examples, the SMU further comprises current limiter circuits configured to receive a further portion of the power from the second electrical power source. In some examples, the SMU further comprises a memory configured to store a bootloader for the processing system. In some examples, the memory is external to the processing system. In some examples, the first electrical power source is a unipolar DC power supply. In some examples, the second electrical power source is a bipolar DC power supply. In some examples, the first and/or second electrical power source is one of a battery, a fuel cell, and a solar cell. In some examples, output channels of the SMU are spatially arranged into a bipolar, unipolar or differential signal output.

Embodiments of the invention further provide an SMU system comprising a multiple-channel DAC, a first electrical power source configured to generate a first electrical power level for a processing system, and a second electrical power source configured to generate a second electrical power level for one or more buffer circuits. The SMU system further comprises one or more sensors operatively coupled to one or more analog-to-digital converter (ADC) circuits. Each DAC circuit and each ADC circuit is configured to receive a control signal of one or more control signals, and to receive a portion of the buffer power input and processing power input. The SMU system further comprises a programming device in communication with the processing system, the programming device being configured to set operational settings of the processing system. In some examples, the first and/or second electrical power source is an AC power supply, and the SMU system further comprises an AC-DC converter configured to convert the input electrical power from an AC power to a unipolar or bipolar DC power prior to supplying it to the SMU system.

In some examples, the SMU further comprises a sensor operatively coupled to the analog-to-digital converter, the sensor being configured to: measure environmental characteristics of an environment in the vicinity of the source measurement unit; and provide a signal indicative of the measured environmental characteristics to the processing system. In certain embodiments, the processing system is further configured to adjust, in response to receiving the signal indicative of the measured environment characteristics, operational parameters of the one or more SMUs to modify a value of the respective plurality of output electrical signals. In some examples, the sensor is powered by a power source shared with processor power input. In some examples, the sensor is one of a current sensor, voltage sensor, power sensor, infrared sensor, temperature sensor, a humidity sensor, and a velocity sensor.

It will be appreciated that the term "processing system" may refer to any electronic processing device or system, or computing device or system, or combination thereof (e.g. computers, web servers, smart phones, laptops, microcontrollers, etc.), and may include a cloud computing system. The processing system may also be a distributed system. In general, processing/computing systems may include one or more processors (e.g. CPUs, GPUs), memory componentry, and an input/output interface connected by at least one bus. They may further include input/output devices (e.g. keyboard, displays, etc.). It will also be appreciated that processing/computing systems are typically configured to execute instructions and process data stored in memory (i.e. they are programmable via software to perform operations on data).

FIG. 1 illustrates an example system 100 for generating and measuring electrical signals.

System 100 comprises a voltage output or voltage source DAC module 110, which is configured to generate one or more voltages or voltage signals based on a control signal.

DAC module 110 may comprise one or more input terminals or channels for receiving one or more control signals, and one or more output terminals or channels for outputting the one or more voltage signals. DAC module 110 may be configured to generate one voltage signal or a plurality of voltage signals, such 4, 8, 16, or any other number, and may therefore have a corresponding number of output terminals. DAC module 110 may comprise one or more DACs. Each DAC of DAC module 110 may be a single-channel or a multi-channel DAC.

Each voltage signal may be an analog signal with a voltage and, in some examples, a current. The control signal may be a digital signal. DAC module 110 may be configured to receive or obtain the control signal from a processing system 120 of system 100. Therefore, DAC module 110 may allow for digitally-controlled conditioning of one or more analog voltages.

The voltage of each voltage signal may depend, at least in part, on the control signal. The voltage of each voltage signal may further depend, at least in part, on a voltage supplied to DAC module 110 by an electrical power supply (not shown) electrically connected to DAC module 110. Therefore, the voltage of each voltage signal may be controlled through the control signal and/or through a power supply voltage.

Each voltage signal may be controllable independently of the other voltage signals (e.g. DAC module 110 may comprise a multiplexer for allowing the control signal to select one or more voltage signals to control). In other examples, DAC module 110 is configured to generate one or more voltages or voltage signals based on one or more control signals.

An output voltage range or span of DAC module 110 may be software-configurable or electrically controllable, for example, through a second digital control signal received or obtained from processing system 120. For example, the output voltage range of DAC module 110 may be switchable between a first range spanning 0 V to 5 V, a second range spanning 0 V to 10 V, and a third range spanning 0 V to 20 V. Each voltage range may have the same resolution or similar resolutions, such as 16 bits.

The voltage signals generated by DAC module 110 may be either positive or negative signals (i.e. signals having a positive or negative voltage). DAC module 110 may further be configured to control the polarity of the one or more voltage signals. DAC module 110 is configured to be supplied with a reference voltage (e.g. the ground voltage), a positive voltage higher than the reference voltage, and a negative voltage lower than the reference voltage. The voltages may be generated by an electrical power supply, such as a bipolar power supply. In other examples, DAC module 110 is configured to be supplied with either a positive voltage or a negative voltage.

A voltage regulator 130 may be electrically connected to power input terminals (e.g. to the positive supply terminal and to a reference terminal) of DAC module 110 for reducing fluctuations in the power or voltage supplied to DAC module 110, and, consequently in the voltages of the one or more voltage signals generated by DAC module 110.

DAC module 110 may be configured to switch between unipolar and bipolar operation, in some examples, without having to manually change its connections to the power supply, as described below with reference to FIGS. 3 and 4.

System 100 further comprises one or more channels. For the purpose of illustration, only channel 140 is shown in FIG. 1, comprising a buffer circuit 142 and an output terminal 150, but it is to be understood that any statement made with respect to channel 140 or its components may also apply to each of the other channels of system 100 and its components. Each channel comprises a buffer circuit, such as buffer circuit 142, and an output terminal, such as output terminal 150.

A separate channel may be provided for, and associated with, each voltage signal generated by DAC module 110, so that, in some examples, there are as many channels as there are voltage signals. In other examples, system 100 comprises any number of channels.

Buffer circuit 142 is a voltage buffer comprising an operational amplifier (op-amp) 144 with a voltage follower architecture, also known as unity gain buffer amplifier. A first input terminal of buffer circuit 142, corresponding to the non-inverting input terminal of op-amp 144, is electrically connected to DAC module 110 for receiving or obtaining one of the voltage signals generated by DAC module 110. An output terminal of buffer circuit 142, corresponding to the output terminal of op-amp 144, is electrically connected to output terminal 150. Buffer circuit 142 further comprises two power supply terminals (VDD and VSS) configured to be electrically connected to a current source (not shown).

In some examples, the current source may form part of a power supply, such as the same power supply or a different power supply from the power supply supplying electric power to DAC module 110. In other examples, the current source forms part of a current-output digital-to-analog converter. The buffer circuits of two or more channels of system 100 may be configured to be electrically connected to the same current source or to different current sources.

Buffer circuit 142 is configured to provide to output terminal 150 a voltage based or dependent on the voltage of the voltage signal received by buffer circuit 142 from DAC module 110. Since buffer circuit 142 is a unity gain buffer amplifier, the voltage provided to output terminal 150 corresponds or is similar to the voltage of the received voltage signal (any discrepancy being mainly due to voltage drops over the components connected between op-amp 144 and output terminal 150, described below). In other examples, buffer circuit 142 comprises any other type of voltage buffer amplifier, including voltage buffers that amplify or otherwise change the input voltage.

It is to be understood that a change in the voltage of the voltage signal received by buffer circuit 142 may result in a corresponding change in the voltage provided by buffer circuit 142 to output terminal 150. Since the voltage signal received by buffer circuit 142 may be controllable through a power supply connected to DAC module 110 (in addition to the control signal), the voltage provided to output terminal 150 may also be said to be controllable through the power supply connected to DAC module 110. Therefore, in some examples, the voltages output by the channels of system 100 may be controlled or changed, at least in part, through a power supply input to system 100.

The value of the voltage at output terminal 150 is defined with reference to the voltage value at a reference output terminal 152. System 100 may comprise one or more reference terminals, such as one reference terminal for each channel. Each reference terminal may be configured to supply the same reference (e.g. ground) voltage.

Since the voltage signal received by buffer circuit 142 is received by the non-inverting input terminal of op-amp 144, the polarity of the voltage provided by buffer circuit 142 to output terminal 150 corresponds to the polarity of the received voltage signal. In other examples, buffer circuit 142 is configured to reverse the polarity of the received voltage signal.

Buffer circuit 142 is further configured to allow current to flow between the current source and output terminal 150. It is to be understood that the flow direction and value of current may depend on the voltage at output terminal 150 and/or on an electrical device electrically connected to output terminal 150 (and to reference output terminal 152). When the electrical device connected to output terminal 150 draws current from output terminal 150, buffer circuit 142 may be configured to allow current to flow from the current source to output terminal 150 (i.e. the current source supplies or delivers a current). When the electrical device supplies current to output terminal 150, buffer circuit 142 may be configured to allow current to flow from output terminal 150 to the current source (i.e. the current source receives or absorbs a current). Therefore, the current source connected to buffer circuit 142 may function both as a current source and a current sink.

Due to the electrical characteristics of op-amp 144, buffer circuit 142 has a high input impedance (i.e. the impedance through the non-inverting terminal of op-amp 144) and a low output impedance (i.e. the impedance through the output terminal of op-amp 144). That is, buffer circuit 142 provides or presents a higher impedance to DAC module 110 than to the electrical device connected to output terminal 150, isolating or increasing the isolation between DAC module 110 and output terminal 150. In some examples, buffer circuit 142 is configured to block, impede, or obstruct a current flow between DAC module 110 and output terminal 150.

Moreover, since the current supplied to the electrical device connected to output terminal 150 is supplied by the current source, system 100 is able to deliver more current to the electrical device than might otherwise be possible if the electrical device were connected directly to DAC module 110, because the one or more DACs that form part of DAC module 110 may be more limited than the current source in the amount of current they can supply.

Each channel may further comprise a current limiter configured to limit or restrict the current flowing between the current source and the output terminal of the channel. One or more current limiters may be operatively connected to each buffer circuit.

In the example illustrated, a current limiter is included in the same integrated circuit as op-amp 144. Such an arrangement is provided, for example, by Texas Instruments OPA548 series operational amplifiers.

The current limiter may be configured to determine or sense the current flowing between buffer circuit 142 to output terminal 150. The current limiter may do this by measuring a voltage across a resistor 146 (e.g. a shunt resistor) electrically connected in series between buffer circuit 142 and output terminal 150. In some examples, resistor 146 is a variable resistor. One terminal of resistor 146 is electrically connected to pin A2 of the integrated circuit of op-amp 144, while the other terminal of resistor 146 is electrically connected to pin A3. Pins A2 and A3 are configured to measure or sense a voltage they receive, allowing for the determination of the voltage across resistor 146 and, consequently, the current flowing through it. The current limiter may then be configured to compare the determined current to a reference value, and to limit the current supplied by buffer circuit 142 if the determined current is greater than or, in some examples, equal to the reference value. The reference value may correspond to a voltage supplied by DAC module 110 to pin A1 of the integrated circuit of op-amp 144. In some examples, the current limiter limits the current if the voltage across resistor 146 exceeds 10 percent of the control voltage applied to pin A1.

System 100 further comprises a voltage measurement system or module 160, which is configured to determine or measure, for each channel, a voltage indicative of the voltage at the output terminal of the channel.

Voltage measurement system 160 comprises a voltage-measurement (or first) analog-to-digital converter (ADC) module 162. ADC module 162 comprises one or more input terminals for receiving analog signals, and one or more output terminals for outputting digital signals based on the received analog signals. ADC module 162 may comprise one or more ADCs. Each ADC of ADC module 162 may be a single-channel or a multi-channel ADC.

Each input terminal of ADC module 162 is electrically connected to a channel of system 100. The example illustrated shows an input terminal of ADC module 162 electrically connected to the output terminal of buffer circuit 142. In other examples, each input terminal of ADC module 162 is electrically connected to a channel of system 100 at any other point, including the input terminal of the channel's buffer circuit.

ADC module 162 connects to channel 140 through a voltage divider 164 comprising two resistors connected in series. In other examples, the voltage divider is any circuit that produces an output voltage that is a fraction or portion of its input voltage. In this way, the voltage received by the input terminal of ADC module 162 is a fraction or portion of the voltage outputted by buffer circuit 142.

ADC module 162 is configured to receive, from each channel to which it is connected, an analog voltage, and to generate one or more voltage measurement signals based on or representing each analog voltage received. Each voltage measurement signal outputted by ADC module 162 may be a digital signal. The analog voltages received by ADC module 162 are related to or indicative of the voltages at the output terminals of system 100. For example, when voltage divider 164 comprises two resistors with the same resistance, the analog voltage received by ADC module is about half of the voltage at output terminal 150. By reducing a voltage being determined before inputting it to ADC module 162 (e.g. through a voltage divider), the range of voltages that can be determined through ADC module 162 is extended.

Therefore, the use of voltage dividers may allow voltage measurement system 160 to measure voltages beyond the input voltage range of ADC module 162. For example, voltage measurement system 160 may be configured to read voltages with magnitudes between 0 V and 40 V when the input voltage range of ADC module 162 is between 0 V and 20 V. The voltage measurement signal outputted by ADC module 162 may then be processed to recover or determine the value of the voltage prior to its reduction by the voltage divider, for example. For example, if voltage divider 164 halves the voltage output by buffer circuit 142, the value denoted by the voltage measurement signal may be multiplied by two to determine the voltage output by the buffer circuit.

System 100 further comprises a current measurement system or module 170, which is configured to determine or measure, for each channel, a current flowing through the output terminal of the channel.

Current measurement system 170 comprises a plurality of current sensors. Each current sensor is configured to sense the current flowing through the output terminal of a channel of system 100, and to generate an analog signal (such as an analog voltage) related to or indicative of the current sensed. Channel 140 comprises a current sensor 172 electrically connected in series between buffer circuit 142 and output terminal 150. The other current sensors may be similarly arranged in the other channels of system 100. In other examples, each current sensor may be connected to any other point of a channel for sensing the current flowing through the output terminal of the channel.

Current measurement system 170 comprises a current-measurement (or second) ADC module 174. ADC module 174 comprises one or more input terminals for receiving analog signals, and one or more output terminals for outputting digital signals based on the received analog signals. ADC module 174 may comprise one or more ADCs. Each ADC of ADC module 174 may be a single-channel or a multi-channel ADC.

Each input terminal of ADC module 174 is electrically connected to a current sensor. The example illustrated shows one of the input terminal of ADC module 174 electrically connected to current sensor 172. ADC module 174 is configured to receive or obtain, from each current sensor to which it is connected, an analog signal (e.g. an analog voltage) related to or indicative of the current sensed by the current sensor, and to generate one or more current measurement signals based on or indicative of the analog signal received from the current sensor. Each current measurement signal outputted by ADC module 174 may be a digital signal.

Processing system 120 may further be configured to communicate with and/or to control, DAC module 110, ADC module 162, and/or ADC module 174. Processing system 120 may be configured to communicate with each of these modules through SPI or through VC, which may allow processing system 120 to control or read multiple channels (e.g. up to 16 channels) of each module simultaneously.

Processing system 120 may further be configured to receive or obtain the voltage measurement signal for each channel of system 100 from ADC module 162, and to determine or calculate the voltage provided by the buffer circuit to the output terminal of a channel of system 100 based on the channel's voltage measurement signal. Similarly, processing system 120 may be configured to receive or obtain the current measurement signal for each channel of system 100 from ADC module 174, and to determine or calculate the current flowing through the output terminal of the channel based on the channel's current measurement signal.

Processing system 120 may further be configured to allow a user to operate or communicate with system 100. For example, users may connect to processing system 120 through an Ethernet connection, a USB connection, or any other communication interface. In some examples, processing system 120 is configured to run a program or instructions provided by a user-supplied computer program (e.g. a Python program). In some examples, processing system 120 operates a graphical user interface (GUI) displayed on a display device. The GUI may allow data (such as measurement data from voltage and current measurement systems 160 and 170) to be displayed to a user. The GUI may further allow a user to input commands for operating system 100 and/or display voltage values, current values, or any other parameter of system 100. For example, commands entered in the GUI by a user may be translated to SPI commands and sent by processing system 120 to DAC module 110, while SPI data received from ADC module 162 or ADC module 174 may be sent by processing system 120 to the GUI. In some examples, processing system 120 comprises a single-board computer.

System 100 further comprises a housing 180 enclosing DAC module 110, processing system 120, voltage regulator 130, channel 140 (and the other channels of system 100), voltage measurement system 160, and current measurement system 170. Electrical connectors of each output terminal of system 100 may be exposed or accessible from an exterior of housing 180 to allow electrical devices to connect thereto. In other examples, housing 180 may enclose only some of the listed components of system 100. For example, processing system 120 may be relocated to an exterior of housing 180 while still being able to communicate and/or control modules that are inside housing 180.

Housing 180 may be disposable or mountable in an electrical equipment rack, such as an electrical equipment rack configured to accommodate a plurality of electrical components. In some examples, system 100 is a standalone, benchtop device.

Figure 2:
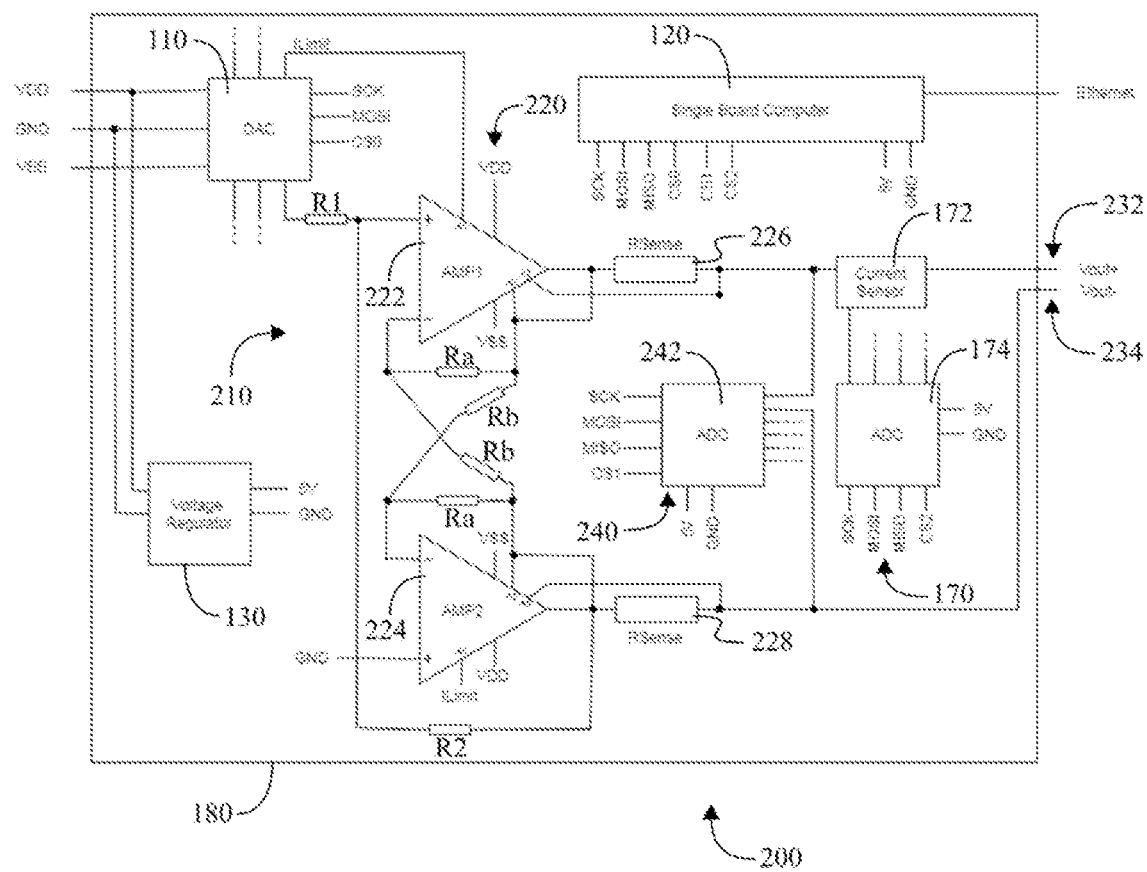
FIG. 2 is another example system for generating and measuring electrical signals with differential outputs.

FIG. 2 illustrates another example system 200 for generating and measuring electrical signals.

System 200 is similar to system 100 of FIG. 1, but further includes a channel 210 comprising a buffer circuit 220 which is configured to provide a differential voltage to a first (or positive) output terminal 232 and a second (or negative) output terminal 234 of channel 210.

For the purpose of illustration, only channel 210 is shown in FIG. 2, but it is to be understood that system 200 may comprise any number of channels, such as one or more, configured to provide a differential voltage to two output terminals, and any statement made with respect to channel 210 or its components may also apply to each of the other channels of system 200 configured to output a differential voltage. In some examples, system 200 comprises one or more channels configured to output a differential voltage (such as channel 210) and one or more channels configured to output a single-ended voltage (such as channel 140 in FIG. 1).

Buffer circuit 220 is a single-ended to differential converter comprising a first op-amp 222 and a second op-amp 224 electrically connected to each other through a resistor network or arrangement. A first input terminal of buffer circuit 220, corresponding to the non-inverting input terminal of op-amp 222, is electrically connected to DAC module 110 for receiving or obtaining one of the voltage signals generated by DAC module 110. A first output terminal of buffer circuit 220, corresponding to the output terminal of op-amp 222, is electrically connected to output terminal 232. A second output terminal of buffer circuit 220, corresponding to the output terminal of op-amp 224, is electrically connected to output terminal 234. Each of op-amp 222 and op-amp 224 further comprises two power supply terminals (VDD and VSS) configured to be electrically connected to a current source (not shown). Both op-amps may connect to the same current source or to different current sources.

Op-amp 222 is configured to provide a first voltage to output terminal 232, while op-amp 224 is configured to provide a second voltage to output terminal 234. The first voltage and the second voltage output by buffer circuit 220 are based or dependent on the voltage of the voltage signal received by buffer circuit 220 from DAC module 110. The symmetry of the voltages output by op-amps 222 and 224 may depend on the values of resistors Ra and Rb. Moreover, the single-ended to differential gain of buffer circuit may be expressed as 2×R2/R1, so that R1 should have double the resistance as R2 to obtain unity gain.

In some examples, the value of resistors R1, R2, Ra, and Rb is set so that the first and second voltages output by buffer circuit 220 have opposite polarities and equal magnitudes. The difference between the two voltages may correspond or be similar to the voltage of the voltage signal received by buffer circuit 220. For example, if the voltage signal input to buffer circuit 220 has a voltage of 10 V, the first output voltage of buffer circuit 220 is about +5 V, and the second output voltage of buffer circuit 220 is about −5 V. In other examples, the two output voltages of buffer circuit 220 may have opposite polarities but different magnitudes.

The differential signal architecture provided by buffer circuit 220, in which the output voltages have no reference to a shared ground, may reduce or eliminate noise between channels and may provide better noise rejection. Noise between the two voltages output by each channel may be filtered out by common-mode rejection.

Buffer circuit 220 is further configured to allow current to flow between the current sources connected to op-amps 222 and 224 and output terminals 232 and 234. Output terminals 232 and 234 may be configured to be connected to the same electrical device, forming a complete circuit so that while one of output terminals 232 and 234 supplies current to the electrical device, the other of output terminals 232 and 234 draws current from the electrical device.

Channel 210 further comprises two current limiters, one for each of op-amps 222 and 224, configured to limit or restrict the current flowing between the current sources connected to buffer circuit 220 and output terminals 232 and 234. Each current limiter may be configured to determine or sense a current flowing between buffer circuit 220 and one of output terminals 232 and 234, for example, by measuring a voltage across resistor connected to between buffer circuit 220 and the respective output terminal. For example, channel 220 comprises a first resistor 226 electrically connected in series between op-amp 222 and output terminal 232, and a second resistor 228 electrically connected in series between op-amp 224 and output terminal 234.

Voltage measurement system 240 is configured to determine or measure a first voltage indicative of the voltage at output terminal 232 and a second voltage indicative of the voltage at output terminal 234. To this end, voltage measurement system 240 comprises a voltage-measurement ADC module 242, which is electrically connected to each of output terminals 232 and 234 for receiving the voltage at each output terminal. ADC module 242 may comprise one or more ADCs configured to measure differential signals, such as AD7606C.

Since the voltage at each output terminal of channel 210 is half of the total output voltage of the channel, there may not be a need to further reduce the voltage sensed by ADC module 242. In other examples, ADC module 242 is electrically connected to channel 210 through one or more voltage dividers for reducing the voltage at the input of ADC module 242, as explained above. ADC module 242 may be configured to generate two voltage measurement signals representing the two output voltages of channel 210. The two voltage measurement signals may then be transmitted to, for example, processing system 120, which is configured to determine the voltage at each of output terminals 232 and 234 and/or the total voltage across both output terminals 232 and 234.

Current measurement system 170 may only be configured to determine or measure the current flowing through one of output terminals 232 and 234 of channel 210. In other examples, current measurement system 170 is configured to determine or measure the current flowing through both output terminals 232 and 234.

Therefore, system 200 may provide differential signal outputs with adjustable current sourcing and/or sinking ability. System 200 may further allow the current of each differential signal to be controlled, with smaller space requirements than prior solutions.

Figure 3:
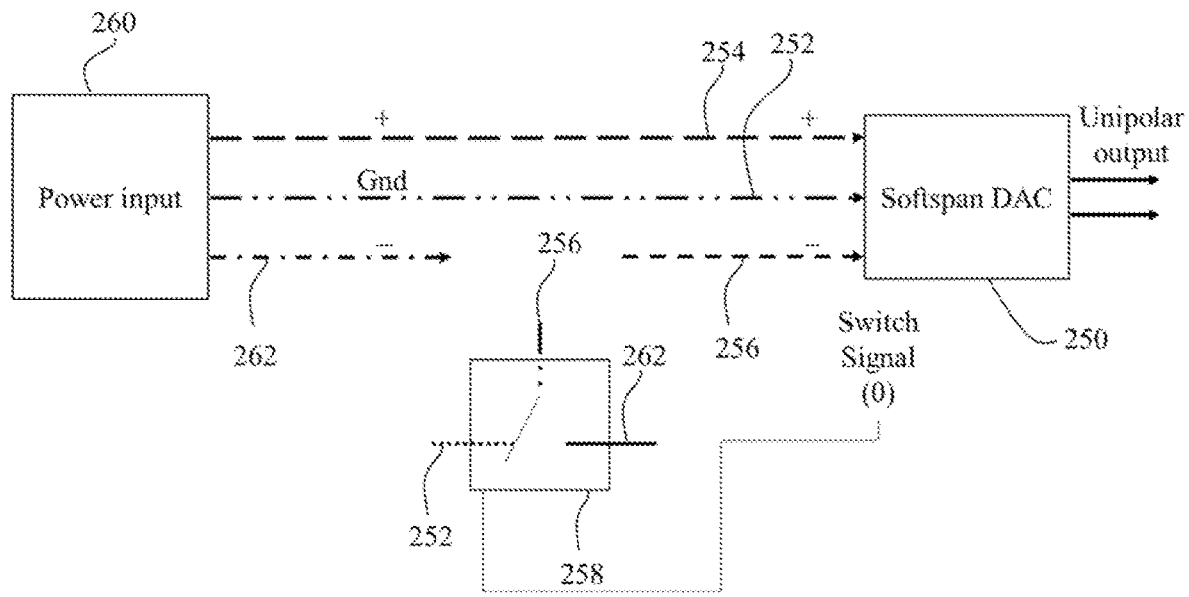
FIG. 3 is an example connection arrangement for supplying unipolar power to a digital-to-analog converter module.
Figure 4:
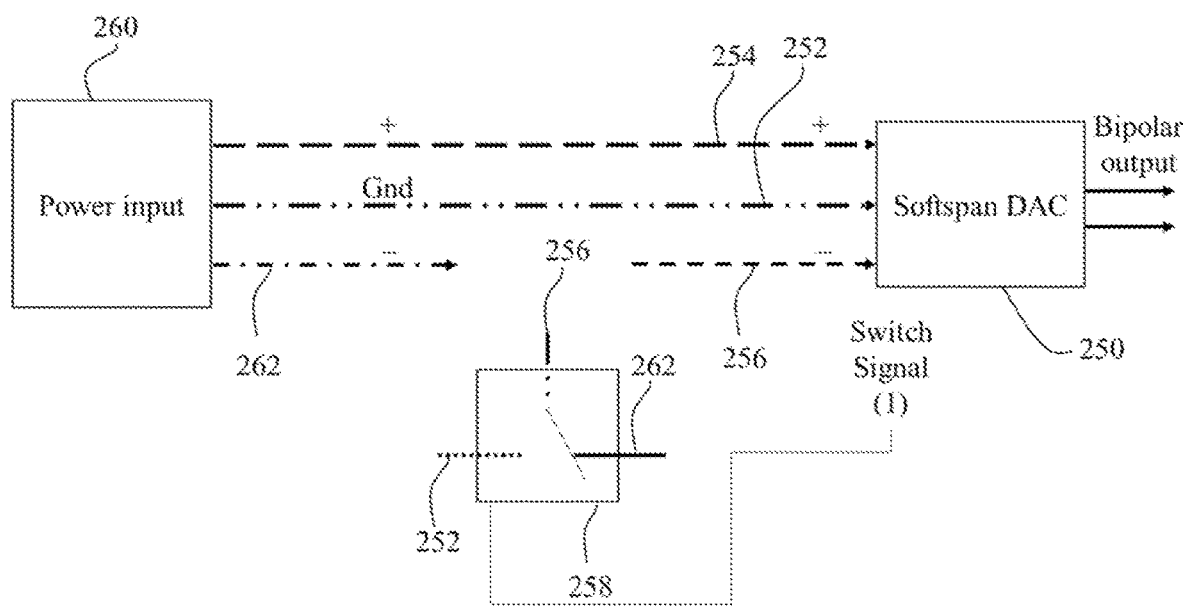
FIG. 4 is an example connection arrangement for supplying bipolar power to a digital-to-analog converter module.

FIGS. 3 and 4 illustrate an example DAC module 250, such as DAC module 110 of FIGS. 1 and 2, electrically connected to an electrical power supply 260, such as a DC power supply.

DAC module 250 comprises a reference (or first) input terminal 252, a positive (or second) input terminal 254, and a third (or negative) input terminal 256. Reference terminal 252 is configured to receive a reference voltage from power supply 260, and positive terminal 254 is configured to receive a positive voltage from power supply 260. The voltage received by negative terminal 256 depends on the state of switch module 258, which is switchable between two states. In a unipolar operation (or first) state of switch module 258, shown in FIG. 3, negative terminal 256 is electrically connected to reference terminal 252 and is configured to not receive a negative voltage from power supply 260 (i.e. negative terminal 256 is electrically disconnected from negative output terminal 262 of power supply 260). In a bipolar operation (or second) state of switch module 258, shown in FIG. 4, negative terminal 256 is electrically disconnected from reference terminal 252 and is configured to receive a negative voltage from power supply 260. Therefore, in the unipolar operation state, reference terminal 252 and negative terminal 256 are shorted and are configured to receive the same, reference voltage, so that DAC module 250 is configured to receive a unipolar, positive voltage from power supply 260. Instead, in the bipolar operation state, reference terminal 252 and negative terminal 256 are electrically disconnected, and positive terminal 254 and negative terminal 256 receive voltages of opposite polarities, so that DAC module 250 is configured to receive a bipolar (i.e. positive and negative) voltage from power supply 260. In other examples, switch module 258 is configured to electrically connect or disconnect positive terminal 254 and reference terminal 252, so that DAC module 250 receives only a negative voltage during unipolar operation.

In some examples, switch module 258 is electrically-controllable, comprising one or more soft-switches operable by a switching signal, so that DAC module 250 can switch between unipolar and bipolar operation through software control. In other examples, switch module 258 is manually controllable, comprising one or more hard or physical switches. A switching signal for selecting or changing the state of switch module 258 may be generated by a processing system (e.g. processing system 120) or by user operation of a hard or soft switch. Switch module 258 may comprise a three-way switch, two relays, or any other type of switch.

Therefore, in some examples, each of systems 100 and 200 provides an SMU able supply positive and/or negative voltages and to deliver and/or absorb current through one or more channels from a single power supply, while simultaneously measuring the voltage and/or current provided by each channel. Systems 100 and 200 may reduce the number of components required to provide an SMU with multiple channels, allowing the number of channels to be scaled up as required (in some examples, between 8 and 120 channels). Systems 100 and 200 may be able to operate with fewer components than prior SMUs, reducing costs. In some examples, systems 100 and 200 allow for the polarity/direction of the voltage and currents they supply to be software-controllable, increasing ease of operation. Moreover, systems 100 and 200 may allow for control or selection of the output voltage and current ranges. Multiple units of system 100 or of system 200 may be daisy-chained, for example, by electrically connecting an output terminal of system 100 or 200 to a power supply input terminal of another one of system 100 or 200, such that the voltage and/or current output by an SMU becomes the input voltage and/or current of another SMU, thus expanding the total number of channels.

Figure 5:
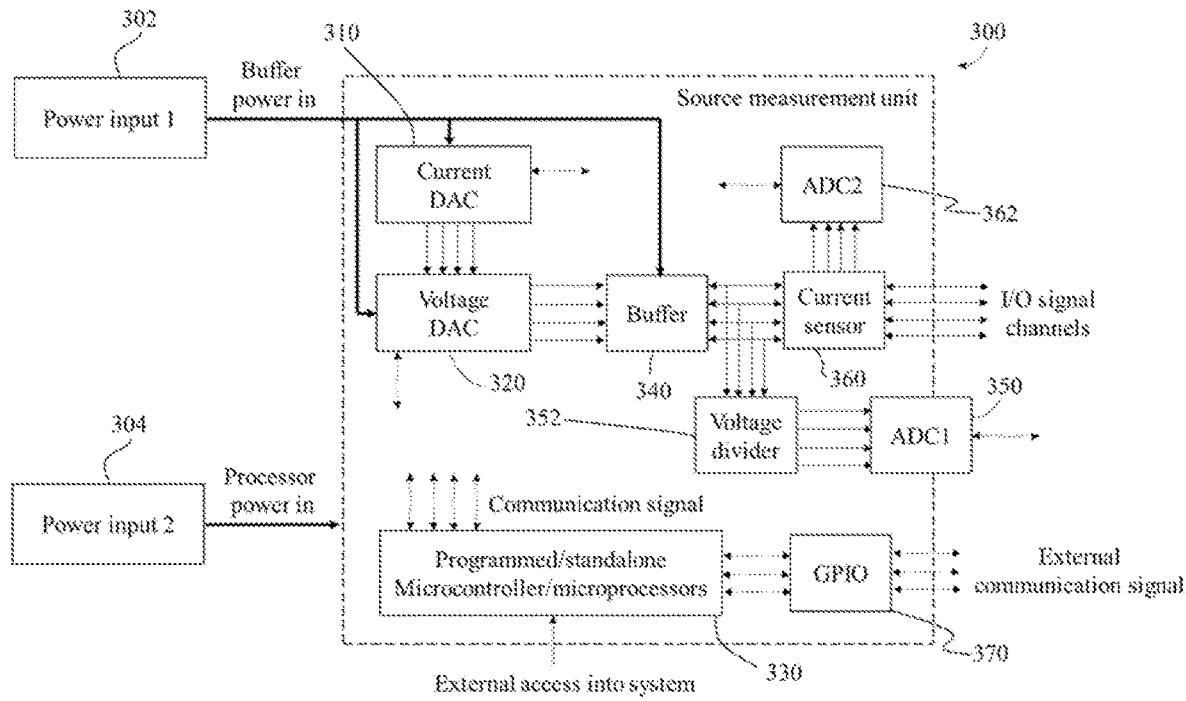
FIG. 5 is another example system for generating and measuring electrical signals.
Figure 6:
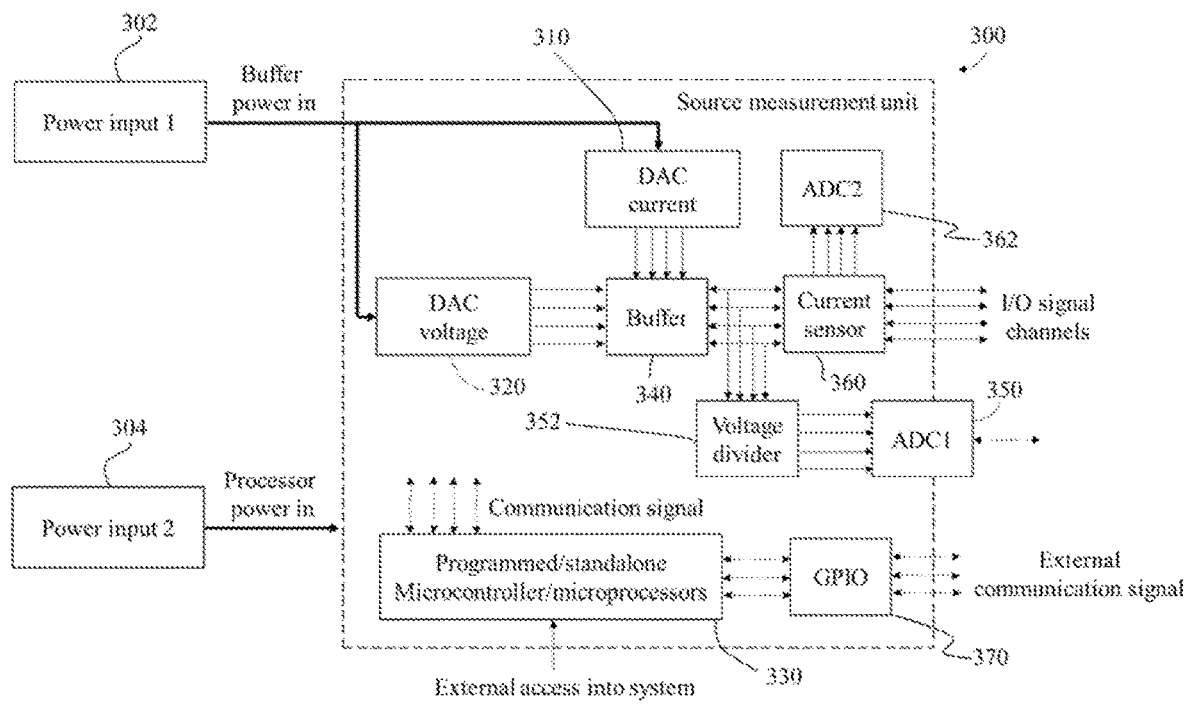
FIG. 6 is another example system for generating and measuring electrical signals.

FIGS. 5 and 6 illustrate another example system 300 for generating and measuring electrical signals.

System 300 comprises a current output (or first) DAC module 310, and a voltage output (or second) DAC module 320. Each of DAC modules 310 and 320 may be configured to receive a separate digital control signal from a processing system 330 of system 300, and to convert the control signal into a plurality of analog signals (i.e. voltage and/or current signals). Each DAC module may operate independently of the other DAC modules of system 300. DAC module 310 is configured to control the current of the analog signals based on one or more control signals received from processing system 330, while DAC module 320 is configured to control the voltage of the analog signals based on one or more control signals received from processing system 330. Therefore, the combination of DAC modules 310 and 320 allows for the current and voltage of the analog signals to be independently controlled.

System 300 further comprises a plurality of buffer circuits 340. In some examples, each buffer circuit 340 is configured to amplify or boost the current of each intermediate analog signal. Each buffer circuit 340 may provide electrical impedance transformation to allow voltages and currents generated by DAC modules 310 and 320 to drive or power electrical devices, in some examples, independently of electrical characteristics (e.g. the impedance) of the electrical devices. Each buffer circuit 340 may comprise a buffer amplifier. In some examples, each buffer circuit 340 "passes on" unchanged to an output terminal of system 300 a voltage generated by DAC module 320, and further amplifies the electrical power supplied to output terminal by amplifying or boosting the current from DAC module 310. Each buffer circuit 340 may therefore be capable of supplying a current greater than a maximum current output limit of DAC module 310.

In some examples, as illustrated in FIG. 5, output terminals of DAC module 310 are electrically connected to DAC module 320, so that current signals generated by DAC module 310 pass through DAC module 320 before being received by buffer circuits 340, which outputs the voltage signals it generates and the current signals generated by DAC module 310). DAC module 320 may comprise one or more analog input terminals configured to receive the current signals generated by DAC module 310; these analog input terminals may be different from digital input terminals configured to receive the digital control signal. In the configuration illustrated in FIG. 5, placing DAC module 310 before DAC module 320 may be advantageous because an attenuation of the current signals passing through DAC module 320 may be less than an attenuation of the voltage signals passing through DAC module 310. In other examples, as illustrated in FIG. 6, current signals generated by DAC module 310 and voltage signals generated by DAC module 320 propagate to buffer circuits 340 through different electrical paths, and may consequently be received by different input channels of buffer circuits 340.

System 300 further comprises a voltage measurement system comprising a plurality of voltage dividers 352 and a voltage-measurement (or first) ADC module 350. An output terminal of each buffer circuit 340 is electrically connected to an input terminal of ADC module 350 through a voltage divider 352. ADC module 350 is configured to convert an analog voltage received from each voltage divider 352 into a digital measurement signal representing the analog voltage value. Each voltage divider 352 scales down or reduces the voltage received from the output terminal of a buffer circuit 340 before providing it to ADC module 350.

System 300 further comprises a current measuring system comprising a plurality of current sensors 360 and a current-measurement (or second) ADC module 362. Each current sensor 360 may comprise one or more measuring instruments configured to measure a current flowing from or into the output terminal of a buffer circuit 340, and to generate an analog measurement signal (e.g. a voltage) based on the measured current. ADC module 362 may be configured to convert the analog measurement signal received from each current sensor 360 into a digital measurement signal representing the measured current value.

Processing system 330 may be configured to generate one or more control signals, and to transmit or supply at least one of said control signals to one or more of DAC module 310, DAC module 320, ADC module 350, ADC module 362, and a general purpose input/output (GPIO) interface 370 of system 300. GPIO interface 370 is configured to allow processing system 330 to communicate with devices external to system 300.

Processing system 330 may further be configured to monitor the output electrical characteristics of each I/O signal channel of system 300. In some examples, processing system 330 relies, at least in part, on measurement signals produced by the voltage and current measurement systems of system 300 to monitor the voltage and/or current outputted by each buffer circuit 340. Processing system 330 may further be configured to receive or obtain sensor signals from any other sensor, including sensors external to system 300, through GPIO interface 370 to monitor any characteristic (e.g. voltage outputs, current outputs, temperature, humidity) of system 300 or its surrounding environment. In response to obtaining the one or more sensor or measurement signals, processing system 330 may be configured to adjust operational parameters of buffer circuits 340, to adjust one or more of its control signals, and/or to adjust any other operational parameter or signal of system 300. In this way, processing system 330 provides a feedback mechanism for monitoring, generating, or calculating signal outputs of system 300.

In some examples, processing system 330 comprises a microcontroller, a microprocessor, a graphics processing unit (GPU), a digital signal processor, a system on chip, and/or one or more field-programmable gate arrays (FPGAs).

System 300 may be powered by two different power supplies: a first power supply 302 and a second power supply 304. Power supply 302 may be a bipolar power supply, configured to supply bipolar electrical power to buffer circuits 340 and DAC modules 310 and 320. Power supply 304 may be a unipolar power supply, configured to supply unipolar electrical power to processing system 330, as well as any other processing or digital device of system 300. Power supplies 302 and 304 may comprise an AC-DC supply, a switched-mode power supply, a linear regulator, a battery, a fuel cell, a solar cell, or any other type of DC power supply.

The power signal supplied to DAC modules 310 and 320 by power supply 302 may also affect the current signals generated by DAC module 310 and/or the voltage signals generated by DAC module 320, and, consequently, the voltage and or current output by each channel of system 300. Therefore, the output voltages and/or currents of system 300 may be controlled, in part, by controlling the power delivered to DAC modules 310 and 320 by power supply 302.

In other examples, system 300 comprises an AC-DC converter electrically connected to a DC-to-DC converter. The DC-to-DC converter may be configured to receive a DC power output from the AC-DC converter, and to generate a first electrical power and a second electrical power. The first and second electrical powers may have different voltage and/or current values. In some examples, the first electrical power is a bipolar power, and the second electrical power is a unipolar power. The first electrical power may be supplied to buffer circuits 340 and DAC modules 310 and 320, while the second electrical power may be supplied to processing system 330, as well as any other processing or digital device of system 300.

Figure 7:
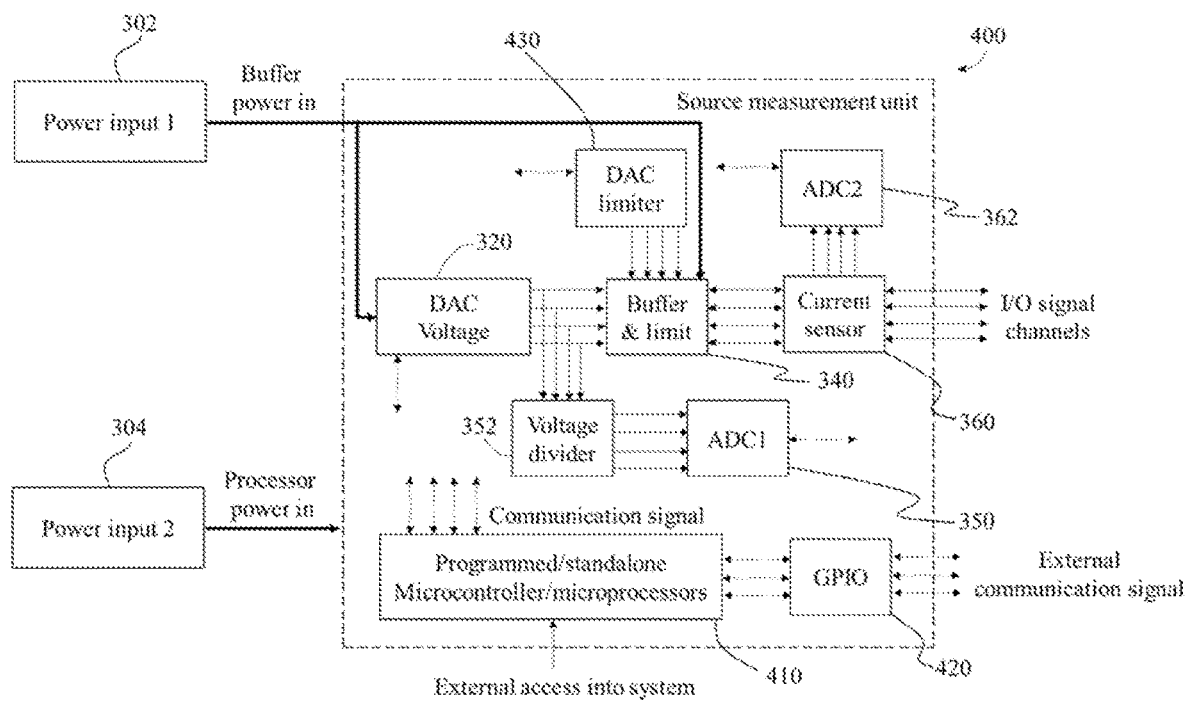
FIG. 7 is another example system for generating and measuring electrical signals.

FIG. 7 illustrates another example system 400 for generating and measuring electrical signals.

System 400 comprises a processing system 410 configured to communicate with one or more devices external to system 400, for example, through GPIO 420 by sending and/or receiving one or more communication signals from said external devices. Communication between system 400 or processing system 410 and the external devices may occur through any wired or wireless interface, such as RS-232, VC, SPI, USB, Wi-Fi, GPRS, narrowband Internet-of-Things (NB-IoT), a low-power, wide area networking protocol (e.g. LoRaWAN™), or LAN. Processing system 410 may be configured to allow a user to set or modify operational settings of system 400. Processing system 410 may further be configured to set or modify values of the output electrical signals generated by system 400. Processing system 410 may therefore be a programming device, such as a personal computer, a laptop, an embedded system, or any other processing system.

In some examples, GPIO 420 is connected to a display device, such as a touch screen device, or any control mechanism, such as a switching mechanism, configured to communicate with processing system 410 through GPIO 420.

System 400 further comprises current limiter circuits 430 configured to limit the current outputted by buffer circuits 340. Current limiters 430 and buffer circuits 340 may form part of a circuit with digital control to enable control of the current limit settings. A current limit imposed by current limiters 430 may be changed to change the current range of the electrical signals output by buffer circuits 340.

In some examples, processing system 410 comprises a microcontroller or microprocessor inbuilt to system 400, and programmable hardware for allowing standalone or remote operation by pre-programming processing system 410 and dynamically controlling the individual output signals. System 400 may also be programmed in a specific manner, such as by setting individual voltage limits, current limit, and other automated functions. For example, system 400 may allow for controlling any device required to stabilise its temperature, humidity, position, velocity, or current by reading and feeding back the outputs from external sensors or transducers.

Figure 8:
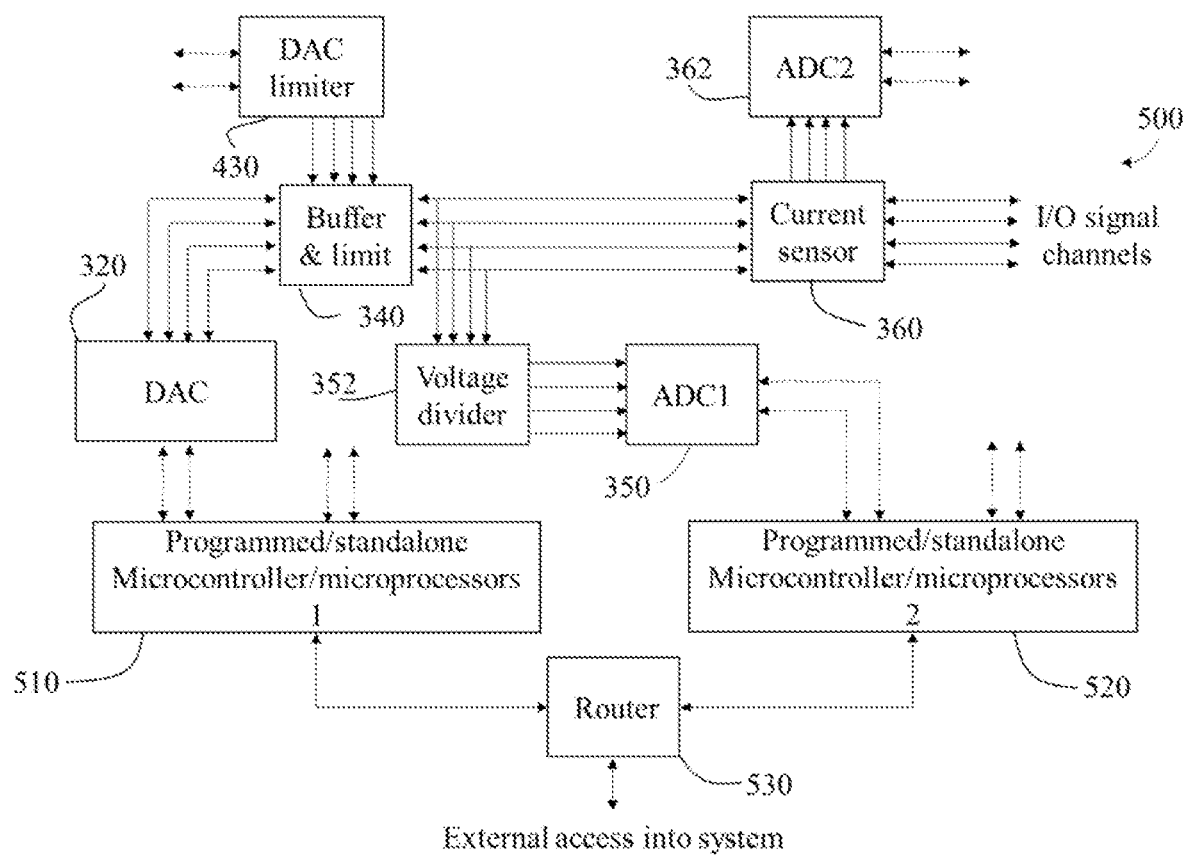
FIG. 8 is another example system for generating and measuring electrical signals.

FIG. 8 illustrates another example system 500 for generating and measuring electrical signals.

System 500 comprises a setting-control (or first) first processing system 510 and a measurement-reading (or second) processing system 520. Processing systems 510 and 520 are operatively coupled or in communication with a router 530 to allow them to be accessed by or communicated with a device external to system 500.

Processing system 510 is also operatively coupled or in communication with each of DAC module 320 and limiter circuits 430, for setting or controlling operational settings of these modules. Processing system 520 is also operatively coupled or in communication with each of ADC modules 350 and 362, for receiving or obtaining measurement signals or data from these modules. The separation between the control of certain modules and the monitoring of other modules between different processing systems may allow these tasks to be performed in parallel, so that system 500 may operate more quickly.

Figure 9:
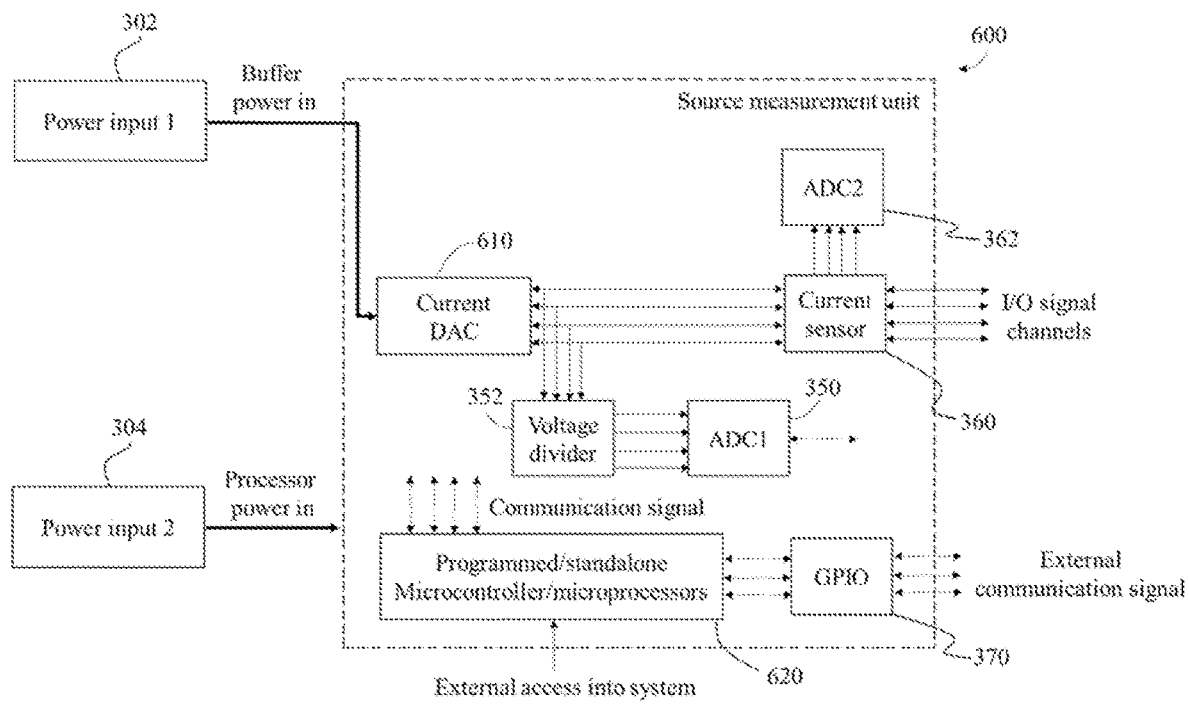
FIG. 9 is another example system for generating and measuring electrical signals.

FIG. 9 illustrates another example system 600 for generating and measuring electrical signals.

System 600 comprises a current output DAC module 610 comprising one or more current sources configured to generate one or more current signals based on a control signal received or obtained from processing system 620. Each current source may be configured to be electrically connected to an electrical device (through an output terminal of system 600). Therefore, system 600 allows control of one or more output currents. It is to be understood that, once a current from a current source flows through the electrical device connected thereto, a voltage may be generated at the output terminal of system 600, dependent on the current and on the electrical characteristics (e.g. the impedance) of the electrical device.

The power signal supplied to DAC module 610 by power supply 302 may also affect the output current from each current source, so that the output current may be controlled, in part, by controlling the power delivered to DAC module 610 by power supply 302.

Each current source of DAC module 610 may provide electrical impedance transformation to allow currents generated by DAC modules 610 to drive or power electrical devices, in some examples, independently of electrical characteristics (e.g. the impedance) of the electrical devices. In some examples, each current source of DAC module 610 comprises a buffer circuit.

Figure 10:
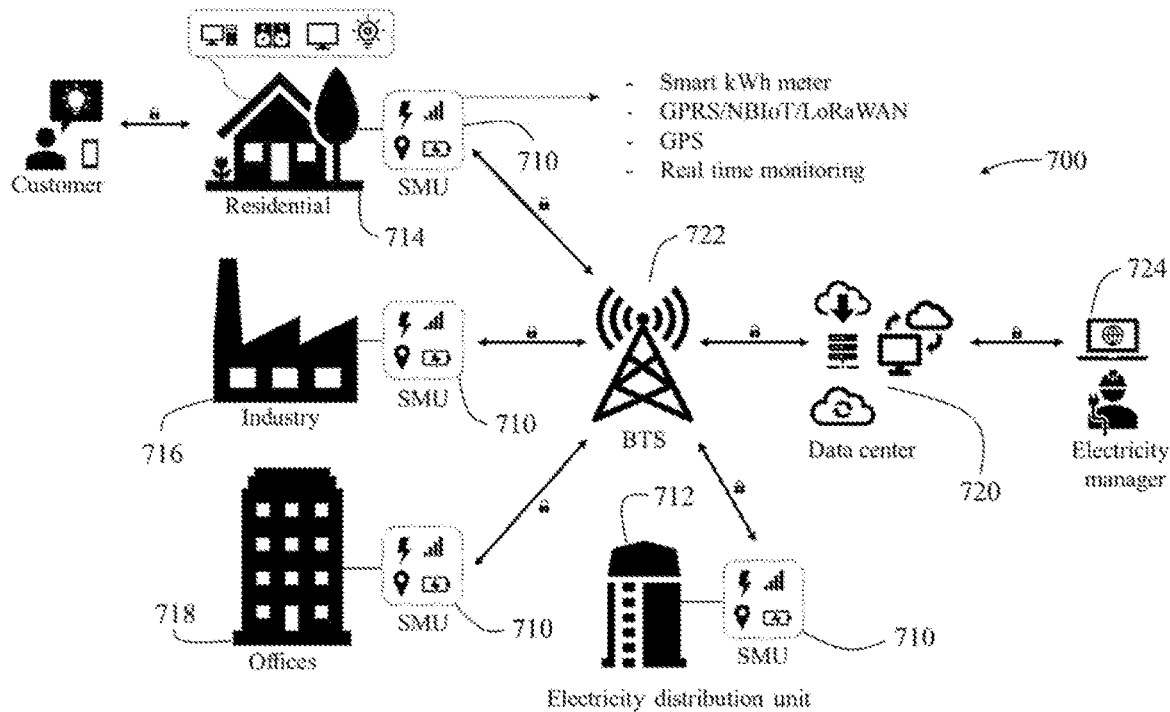
FIG. 10 is an example system for monitoring electricity consumption.

FIG. 10 illustrates an example system 700 for monitoring electricity consumption.

System 700 comprises a plurality of SMUs 710, which may be SMUs according to any of the foregoing systems for generating and measuring electrical signals. Each SMU is configured to supply electrical power to one or more electrical devices and to measure or determine the power (i.e. voltage and current) supplied to the one or more electrical devices. The electrical devices may be electrical devices connected to an electricity distribution unit 712, or they be electrical devices as are typically found in residential areas 714 (e.g. computers, speakers, televisions, lighting), in industry 716, in offices 718, or in any other field.

System 700 further comprises a data centre 720 configured to receive power measurement data representing voltages and currents supplied and measured by each SMU 710. Each SMU 710 may be configured to send the collected power measurement data to a wireless base transceiver station (BTS) 722, from where the data is transferred to data centre 720.

The power measurement data in data centre 720 may be accessed by a central power management system 724, such as the central management system of an operator of the electrical grid that supplies power to SMUs 710. Therefore, each SMU 710 may function as a smart electricity or kWh meter to allow an operator and/or end users of an electrical grid to monitor electricity usage and, in some examples, to manage their electricity bills.

Figure 11:
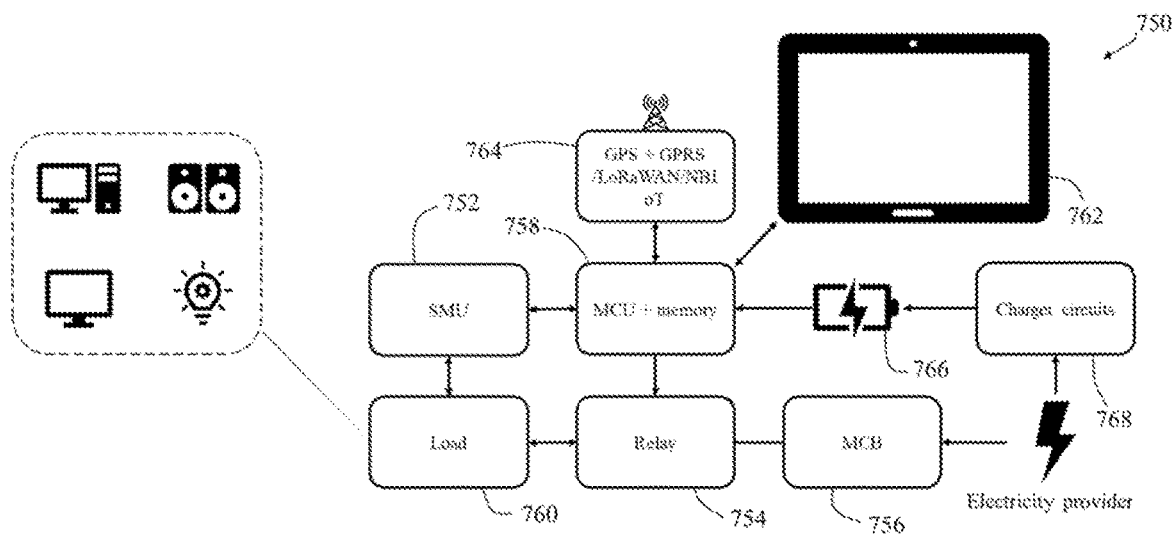
FIG. 11 is an example electricity meter.

FIG. 11 illustrates an example electricity or kWh meter 750, or a system for monitoring electricity consumption. In some examples, electricity meter 750 is an electricity billing system for residential, office, or industry spaces.

Electricity meter 750 comprises an SMU 752, which may be an SMU according to any of the foregoing systems for generating and measuring electrical signals. A switch module of electricity meter 750 comprises a relay 754 and a circuit breaker 756, such as a miniature circuit breaker. In other examples, the switch module comprises one or more switches of any type. The switch module is configured to electrically connect SMU 752 to an electrical source, such as an electrical grid or mains power, for supplying electrical power to active components of SMU 752. In some examples, electricity meter 750 further comprises one or more power converters configured to convert or transform power from the electrical source to a level suitable for powering SMU 752.

Electricity meter 750 further comprises a processing system 758, such as a microcontroller, including a memory, configured to receive data representing measurements, performed by SMU 752, of voltages and currents supplied by SMU 752 to one or more electrical devices or loads 760 electrically connected to one or more output terminals of SMU 752. Processing system 758 is further configured to operate a display device 762, such as a touch screen display, of electricity meter 750 to display the received data or electricity usage information derived from the received data.

Electricity meter 750 further comprises a communication module 764, such as a wireless communication interface, configured to send or provide the data received by processing system 758 to, for example, an electricity provider operating the electricity source. Therefore, electricity meter 750 may be configured to enable the measurement of electricity usage by an electricity provider and to transfer the usage data to, for example, a data processing unit of the electricity provider via wireless communication.

Electricity meter 750 may further comprise an energy storage device 766, such as a battery, and electrical charging module 768 configured to receive electricity from the electricity source and to store electrical energy in energy storage device 766. Energy storage device 766 may be configured to supply electrical power to SMU 752 and to any other active component of electricity meter 750 (e.g. processing system 758, display device 762, and communication module 764), for example, in the event of a power outage.

Figure 12:
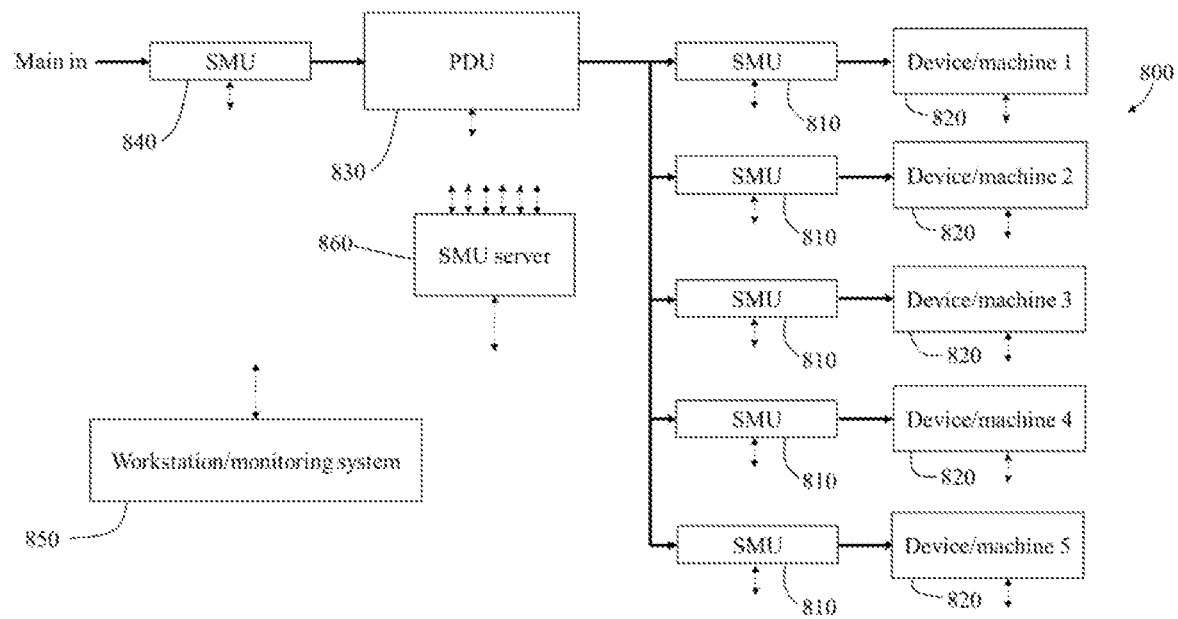
FIG. 12 is an example system for monitoring a plurality of independent source measure units.

FIG. 12 illustrates an example system 800 for monitoring a plurality of independent SMUs 810, which may be SMUs according to any of the foregoing systems for generating and measuring electrical signals.

Each SMU 810 is configured to supply electrical power to one or more electrical devices or machines 820, and to measure or determine the supplied electrical power. Devices 820 may comprise any electrically-powered device, such as devices used in data centre management systems, power plants, or any application that requires the operation of multiple electrical loads, such as motors, pumps, coolers, or heaters.

System 800 comprises a power distribution unit (PDU) 830 configured to receive electrical power from a power source 840, such as another SMU, and to distribute the received electrical power to a plurality of outlets of PDU 830. Each SMU 810 is electrically connected to an outlet of PDU 830 for receiving a portion of the electrical power distributed by PDU 830.

System 800 further comprises a processing system or monitoring system 850 configured to receive data representing voltages and currents determined or measured by each SMU 810, and to control operational parameter of each SMU 810 (e.g. by generating one or more digital control signals used for controlling each SMU 810). Processing system 850 may further be configured to read and control the power usage, including current and voltage, of each electrical device 820.

System 800 further comprises a server 860 configured to manage data for short-range communication between different SMUs 810 or sensors of SMUs 810, and to operate as a buffer for scaling or increasing the number of SMUs 810 in system 800 being monitored by processing system 850. Communication between the components of system 800 may use any communication means, such as Ethernet, LAN, NBIoT, WiFi, LoRAWAN, GPRS, and/or fibre optic communication methods including line of sight communication or via fibre optics line.

Server 860 may be a communications server, configured to allow different SMUs 810 to communicate with each other, and may further function as a central communication server configured to allow a command station (such as processing system 850) to communicate and/or control to all devices of system 800 through a wireless or wired connection.

Therefore, system 800 may provide an arrangement of multiple source measurement units 810 that allows for the measurement and control of power supplied to multiple devices or machines 820.

Figure 13:
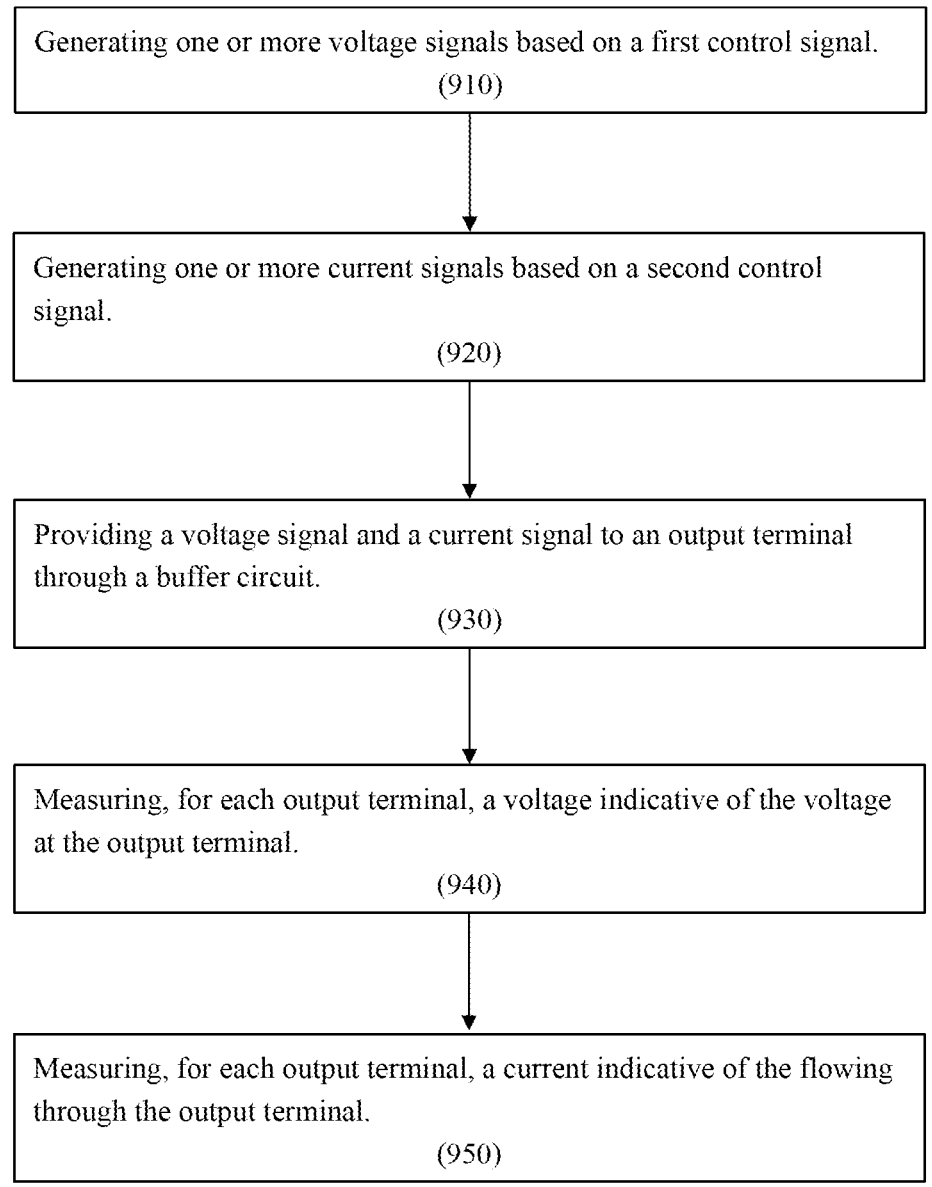
FIG. 13 is a flow chart of an example method for generating and measuring electrical signals.

FIG. 13 illustrates a flow chart of an example method 900 for generating and measuring electrical signals, or for operating a source measure unit.

Method 900 comprises a step 910 of generating one or more voltage signals based on a first control signal.

Method 900 further comprises a step 920 of generating one or more current signals based on a second control signal.

The one or more voltage and current signals may be generated by voltage or current source DACs, by current sources, by voltage sources, or by power supplies.

Method 900 further comprises a step 930 of providing, for each voltage signal and each current signal, the voltage signal and the current signal to an output terminal through a buffer circuit. The output terminal may be electrically connected to the buffer circuit. Each combination of a voltage signal and current signal may be provided to a separate output terminal through a separate buffer circuit, so that there may be one or more output terminals and one or more buffer circuits (e.g. one for each voltage signal).

Method 900 further comprises a step 940 of measuring, for each output terminal, a voltage indicative of the voltage at the output terminal.

Method 900 further comprises a step 950 of measuring, for each output terminal, a current indicative of the flowing through the output terminal.

The foregoing systems and methods may provide several advantageous effects, such as one or more of the following:

1) high resolution control of voltage and current through the combination of a voltage digital-to-analog converter and a current digital-to-analog converter;
2) allowing simple switching of bipolar, unipolar, and differential mode setting with digital control including current source and sink;
3) integrated buffer circuits may reduce buffer requirement and amplifier for large scale channel output voltage and current range requirement;
4) multi-ADC for voltage reading may enable real-time reading of voltage from sensors with simple voltage divider combine with multi-ADC arrangement;
5) parallel arrangement of processing systems that separates voltage/current control and reading in integrated circuits may make the data transfer, control and reading faster;
6) integrated wireless device arrangement may reduce full operating system to enable faster transfer of current and voltage reading data;
7) software span switch may allow the circuits to be configured with different ranges of output, without reducing resolution control of voltage and current;
8) more accurate and transparent electricity data use provided to customer from electricity utility distributor and supplier;
9) increased customer awareness of electricity use;
10) providing kWh meter position via GPS to locate the device via GPRS/NBIot/LoRaWAN;
11) better customer satisfaction (faster repair due to easier customer position tracking via GPS);
12) control electricity use by monitoring daily need with data;
13) low-cost integrated electricity monitoring system;
14) enabling early device fault detection to avoid customer electricity line blackout;
15) track daily and monthly electricity use via mobile, mobile applications, and/or PC;
16) receiving electricity bill via email/phone/apps;
17) online electricity bill payment via payment gateway;
18) allow users to send complaints and feedback online with their user ID;
19) enabling prepaid and postpaid electricity arrangements;
20) sensors for measuring voltage, current, and kWh, and for sending measurement data to data centres via GPRS/NBIoT/LoraWan regularly;
21) low-power device to enable small battery/power backup deployment and longer operation;
22) enabling remote on/off customer electricity line from kWh meter;
23) displaying real time electricity use on smart kWh meter display;
24) compact device compliant to electricity standards;
25) GPRS/NBIoT/LoraWAN/GPS device support for communication; and
26) enabling internal records via SD card for data backup.

Optional embodiments may also be said to broadly include the parts, elements, steps and/or features referred to or indicated herein, individually or in any combination of two or more of the parts, elements, steps and/or features, and where specific integers are mentioned which have known equivalents in the art to which the invention relates, such known equivalents are deemed to be incorporated herein as if individually set forth.

Throughout this specification and the claims which follow, unless the context requires otherwise, the word "comprise", and variations such as "comprises" or "comprising", will be understood to imply the inclusion of a stated integer or step or group of integers or steps but not the exclusion of any other integer or step or group of integers or steps.

RELATED APPLICATIONS

The originally filed specification of the following related application is incorporated by reference herein in its entirety: Australian Provisional Patent Application 2020902625, filed 27 Jul. 2020.

The invention claimed is:
1. A system for generating and measuring electrical signals, the system comprising:
a digital-to-analog converter module configured to generate two or more analog signals based on a control signal;
two or more channels, each channel comprising:
an output terminal configured to be electrically connected to an electrical device; and
a buffer circuit configured to receive an analog signal of the two or more analog signals and to provide to the output terminal a voltage based on the voltage of the received analog signal, and further configured to be electrically connected to a current source and to allow current to flow between the current source and the output terminal;
a voltage measurement system configured to measure, for each channel, a voltage indicative of the voltage at the output terminal of the channel; and
a current measurement system configured to measure, for each channel, the current flowing through the output terminal of the channel;

wherein the digital-to-analog converter module is a voltage source digital-to-analog converter module configured to control the voltage of the two or more analog signals based on the control signal and on a voltage received from a power supply;

wherein the voltage measurement system comprises a voltage-measurement analog-to-digital converter module configured to:

receive, from each channel, an analog voltage indicative of the voltage at the output terminal of the channel; and generate, for each channel, a voltage measurement signal representing the analog voltage received from the channel, wherein the voltage measurement signal is a digital signal, wherein the voltage-measurement analog-to-digital converter module is electrically connected to each channel through a voltage divider.

2. The system of claim 1, wherein the two or more analog signals are two or more voltage signals, wherein the control signal is a first control signal, wherein the current source is a current source digital-to-analog converter module configured to generate two or more current signals based on a second control signal, and, for each of the two or more channels, the buffer circuit is configured to receive a current signal of the two or more current signals, and to provide the current signal to the output terminal of the channel.

3. The system of claim 1, wherein the digital-to-analog converter module is configured to control the polarity of the two or more analog signals, the digital-to-analog converter module comprising:

a first terminal configured to receive a first voltage, wherein the first voltage is a reference voltage;

a second terminal configured to receive a second voltage, wherein the second voltage is different from the reference voltage; and a third terminal;

wherein the system further comprises a switch module operatively connected to the digital-to-analog converter module, the switch module being switchable between:

a first state in which the third terminal is electrically connected to the first terminal for receiving the reference voltage; and a second state in which the third terminal is electrically disconnected from the first terminal and is configured to receive a third voltage, wherein the third voltage and the second voltage have opposite polarities.

4. The system of claim 1, wherein, for each channel of one or more of the channels, the buffer circuit is configured to:

allow the current source to supply a current to the output terminal when the electrical device draws the current from the output terminal; and allow the current source to receive a current from the output terminal when the electrical device supplies the current to the output terminal.

5. The system of claim 1, wherein, for each channel of one or more of the channels, the channel further comprises a current limiter configured to limit a flow of current between the current source and the output terminal, wherein the current limiter is further configured to:

determine the current supplied by the current source to the output terminal;

compare the determined current to a reference value; and limit the current supplied by the current source to the output terminal if the determined current is greater than the reference value;

wherein the current limiter is configured to determine the current supplied by the current source to the output terminal by measuring a voltage across a resistor electrically connected between the buffer circuit and the output terminal.

6. The system of claim 1, wherein, for each channel of one or more of the channels, the buffer circuit is configured to block or obstruct a flow of current between the digital-to-analog converter module and the output terminal.

7. The system of claim 1, wherein, for each channel of one or more of the channels, the buffer circuit provides a higher impedance to the digital-to-analog converter module than to the output terminal and the current source.

8. The system of claim 1, wherein, for each channel of one or more of the channels, the buffer circuit comprises a current source digital-to-analog converter configured to generate a current signal based on a further control signal.

9. The system of claim 1, wherein, for each channel of one or more of the channels, the buffer circuit comprises a buffer amplifier.

10. The system of claim 1, wherein, for each channel of one or more of the channels, the output terminal is a first output terminal, the channel further comprising a second output terminal configured to be electrically connected to the same electrical device as the first output terminal, wherein the buffer circuit is configured to provide a differential voltage corresponding to the voltage of the received analog signal to the first output terminal and the second output terminal, and further configured to allow current to flow between the current source and the second output terminal, wherein the buffer circuit comprises a single-ended to differential converter configured to provide a first voltage to the first output terminal and a second voltage to the second output terminal, wherein the difference between the first voltage and the second voltage corresponds to the voltage of the received analog signal.

11. The system of claim 1, wherein the current measurement system comprises:

two or more current sensors, each current sensor being configured to sense the current flowing through the output terminal of a channel of the two or more channels; and a current-measurement analog-to-digital converter module configured to:

receive, from each current sensor, an analog signal indicative of the current sensed by the current sensor; and generate, for each channel, a current measurement signal representing the analog signal received from the current sensor associated with the channel, wherein the current measurement signal is a digital signal.

12. The system of claim 11, further comprising a measurement-reading processing system configured to:

receive the voltage measurement signal and the current measurement signal for each channel;

determine, for each channel, the voltage at the output terminal of the channel based on the received voltage measurement signal; and determine, for each channel, the current flowing through the output terminal of the channel based on the received current measurement signal;

wherein the measurement-reading processing system is configured to communicate with the voltage-measurement analog-to-digital converter module and with the current-measurement analog-to-digital converter module through a serial peripheral interface (SPI) or I²C.

13. The system of claim 12, further comprising a communication module configured to:

receive, from the measurement-reading processing system, the determined voltage and the determined current values for each channel of one or more of the channels; and transmit the received voltage and current values to a remote receiver.

14. The system of claim 1, wherein, for at least one channel of the two or more channels, the buffer circuit is configured to amplify the received current signal.

15. The system of claim 9, wherein the buffer amplifier comprises a voltage follower.

16. The system of claim 1, further comprising a setting-control processing system configured to generate the control signal and send the control signal to the digital-to-analog converter module through a serial peripheral interface (SPI) or I²C.

17. A system for generating and measuring electrical signals, the system comprising:
- a current source digital-to-analog converter module configured to generate two or more current signals based on a control signal and on an electric power received from a power supply;
- two or more channels, each channel comprising an output terminal configured to be electrically connected to an electrical device, wherein each channel is configured to receive a current signal of the two or more current signals and to provide the current signal to the output terminal of the channel;
- a voltage measurement system configured to measure, for each channel, a voltage indicative of the voltage at the output terminal of the channel; and
- a current measurement system configured to measure, for each channel, the current flowing through the output terminal of the channel;
- wherein the voltage measurement system comprises a voltage-measurement analog-to-digital converter module configured to:
  - receive, from each channel, an analog voltage indicative of the voltage at the output terminal of the channel, and
  - generate, for each channel, a voltage measurement signal representing the analog voltage received from the channel, wherein the voltage measurement signal is a digital signal;
- wherein the voltage-measurement analog-to-digital converter module is electrically connected to each channel through a voltage divider.

18. A method for generating and measuring electrical signals, the method comprising:
- generating two or more voltage signals based on a first control signal and on a voltage received from a power supply;
- generating two or more current signals based on a second control signal;
- providing, for each voltage signal and each current signal, the voltage signal and the current signal to an output terminal of two or more output terminals through a buffer circuit of two or more buffer circuits;
- measuring, for each output terminal, a voltage indicative of the voltage at the output terminal; and
- measuring, for each output terminal, a current indicative of the flowing through the output terminal;
- wherein measuring a voltage indicative of the voltage at one of the output terminals comprises, for each output terminal;
  - receiving, through a voltage divider electrically connected to the output terminal, an analog voltage indicative of the voltage at the output terminal; and
  - generating a voltage measurement signal representing the received analog voltage, wherein the voltage measurement signal is a digital signal.

19. The method of claim 18, wherein each buffer circuit provides a higher impedance to the voltage signal than to the current signal.

20. The method of claim 19, further comprising amplifying one or more of the current signals.

* * * * *